(12) United States Patent
Yang et al.

(10) Patent No.: US 11,545,643 B2
(45) Date of Patent: *Jan. 3, 2023

(54) ORGANIC ELECTROLUMINESCENCE DISPLAY DEVICE

(71) Applicant: Samsung Display Co., Ltd., Yongin-si (KR)

(72) Inventors: Jungjin Yang, Seoul (KR); Myunghwan Kim, Hanam-si (KR); Seohyun Kim, Seoul (KR); Ji-young Kim, Seoul (KR); Jinwoo Park, Yongin-si (KR); Wonjun Song, Hwaseong-si (KR); Taewoong Yoo, Seoul (KR); Soojung Youn, Seoul (KR); Kwanhee Lee, Suwon-si (KR); Seokjae Lee, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/352,111

(22) Filed: Jun. 18, 2021

(65) Prior Publication Data
US 2021/0313537 A1    Oct. 7, 2021

Related U.S. Application Data

(63) Continuation of application No. 16/383,362, filed on Apr. 12, 2019, now Pat. No. 11,043,649.

(30) Foreign Application Priority Data

Apr. 24, 2018    (KR) .................. 10-2018-0047519

(51) Int. Cl.
*H01L 51/52*    (2006.01)
*H01L 27/32*    (2006.01)
*H01L 51/50*    (2006.01)

(52) U.S. Cl.
CPC ...... *H01L 51/5203* (2013.01); *H01L 27/3209* (2013.01); *H01L 51/5056* (2013.01); *H01L 51/5072* (2013.01)

(58) Field of Classification Search
None
See application file for complete search history.

(56) References Cited

U.S. PATENT DOCUMENTS

| | | | |
|---|---|---|---|
| 8,633,475 | B2 | 1/2014 | Endo et al. |
| 8,941,096 | B2 | 1/2015 | Tsutsui et al. |

(Continued)

FOREIGN PATENT DOCUMENTS

| | | |
|---|---|---|
| EP | 3125330 A1 | 2/2017 |
| JP | 2012-49088 A | 3/2012 |

(Continued)

OTHER PUBLICATIONS

EPO Extended Search Report dated Sep. 23, 2019, for corresponding European Patent Application 19166938.1 (8 pages).

*Primary Examiner* — Ashok Patel
(74) *Attorney, Agent, or Firm* — Lewis Roca Rothgerber Christie LLP

(57) ABSTRACT

An organic electroluminescence display device includes: a substrate; a first electrode including a first sub-electrode and a second sub-electrode spaced apart from each other and on the substrate; a first light emitting unit on the first electrode; a charge generation unit on the first light emitting unit; a second light emitting unit on the charge generation unit; and a second electrode on the second light emitting unit, wherein the first light emitting unit comprises a first light emitting layer correspondingly on the first sub-electrode; and a second light emitting layer correspondingly on the second sub-electrode, wherein the second light emitting unit comprises a third light emitting layer correspondingly on the first (Continued)

light emitting layer; and a fourth light emitting layer correspondingly on the second light emitting layer.

23 Claims, 14 Drawing Sheets

(56) References Cited

U.S. PATENT DOCUMENTS

| | | | |
|---|---|---|---|
| 9,209,422 | B2 | 12/2015 | Lee |
| 9,634,293 | B2 | 4/2017 | Shin et al. |
| 9,692,002 | B2 | 6/2017 | Choi et al. |
| 9,721,997 | B2 | 8/2017 | Lee |
| 9,780,325 | B2 | 10/2017 | Lee |
| 9,960,380 | B2 | 5/2018 | Kim et al. |
| 11,043,649 | B2 * | 6/2021 | Yang .................. H01L 51/5278 |
| 2006/0040132 | A1 | 2/2006 | Liao et al. |
| 2016/0181562 | A1 | 6/2016 | Pieh et al. |
| 2017/0358767 | A1 * | 12/2017 | Okamoto ............ H01L 51/5206 |
| 2018/0006260 | A1 | 1/2018 | Yoon et al. |
| 2018/0097052 | A1 | 4/2018 | Seok et al. |

FOREIGN PATENT DOCUMENTS

| | | | |
|---|---|---|---|
| JP | 2013-127858 | A | 6/2013 |
| KR | 10-2007-0043014 | A | 4/2007 |
| KR | 10-2015-0131854 | A | 11/2015 |
| KR | 10-2016-0078782 | A | 7/2016 |
| KR | 10-2017-0014518 | A | 2/2017 |
| KR | 10-1705408 | B1 | 2/2017 |
| KR | 10-2018-0003710 | A | 1/2018 |

* cited by examiner

ORGANIC ELECTROLUMINESCENCE DISPLAY DEVICE

CROSS-REFERENCE TO RELATED APPLICATIONS

This application is a continuation of U.S. patent application Ser. No. 16/383,362, filed Apr. 12, 2019, which claims priority to and the benefit of Korean Patent Application No. 10-2018-0047519, filed Apr. 24, 2018, the entire content of both of which is incorporated herein by reference.

BACKGROUND

As an image display device, an organic electroluminescence display device has been actively developed. Organic electroluminescence display devices are different from liquid crystal display devices and are so-called self-luminous organic electroluminescence display devices that recombine the holes and electrons injected from a first electrode and a second electrode in a light emitting layer to display images by utilizing a emitting a light emitting material.

An organic light emitting display device including a first electrode, a hole transport layer on the first electrode, a light emitting layer on the hole transport layer, an electron transport layer on the light emitting layer, and a second electrode on the electron transport layer may be utilized as an organic electroluminescence display device, for example. Holes are injected from the first electrode, and the injected holes move into the hole transport layer and are injected into the light emitting layer. On the other hand, electrons are injected from the second electrode, and the injected electrons move through the electron transport layer and are injected into the light emitting layer. The recombination of holes and electrons injected into the light emitting layer generates excitons in the light emitting layer. The organic electroluminescence display emits light using light generated when the excitons fall back to the ground state.

The above information discussed in the present Background section is only for enhancement of understanding of the background of the invention and therefore it may contain information that does not constitute prior art.

SUMMARY

Aspects of some example embodiments of the present disclosure relate to an organic electroluminescence display device, for example, an organic electroluminescence display device including two light emitting units and a charge generation unit between two light emitting units.

Aspects of some example embodiments of the present disclosure include an organic electroluminescence display device of high efficiency and long life.

Aspects of some example embodiments of the present disclosure include an organic electroluminescence display device having excellent processing efficiency.

Aspects of some example embodiments of the present disclosure include an organic electroluminescence display device including: a substrate; a first electrode including a first sub-electrode and a second sub-electrode spaced apart from each other and on the substrate; a first light emitting unit on the first electrode; a charge generation unit on the first light emitting unit; a second light emitting unit on the charge generation unit; and a second electrode on the second light emitting unit, wherein the first light emitting unit includes a first light emitting layer correspondingly on the first sub-electrode; and a second light emitting layer correspondingly on the second sub-electrode, wherein the second light emitting unit includes a third light emitting layer correspondingly on the first light emitting layer; and a fourth light emitting layer correspondingly on the second light emitting layer, wherein the charge generation unit includes: an n-type charge generation layer on the first light emitting layer and the second light emitting layer; and a p-type charge generation layer including a first p-type charge generation layer on the n-type charge generation layer and correspondingly on the first light emitting layer, and a second p-type charge generation layer correspondingly on the second light emitting layer.

In an embodiment, the first light emitting layer and the third light emitting layer may be layers that emit light of the same color, the second light emitting layer and the fourth light emitting layer may be layers that emit light of the same color, and the first light emitting layer and the second light emitting layer may be layers that emit light of different colors.

In an embodiment, the first p-type charge generation layer and the second p-type charge generation layer may be spaced apart from each other.

In an embodiment, the first electrode may further include a third sub-electrode spaced apart from the first sub-electrode and the second sub-electrode, the first light emitting unit may further include a fifth light emitting layer correspondingly on the third sub-electrode, the second light emitting unit may further include a sixth light emitting layer correspondingly on the fifth light emitting layer, and the p-type charge generation layer may further include a third p-type charge generation layer correspondingly on the fifth light emitting layer.

In an embodiment, the fifth light emitting layer and the sixth light emitting layer may be layers that emit the same color, and the fifth light emitting layer may be a layer that emits a different color from each of the first light emitting layer and the second light emitting layer.

In an embodiment, each of the first light emitting layer and the third light emitting layer may be a red light emitting layer, each of the second light emitting layer and the fourth light emitting layer may be a green light emitting layer, and each of the fifth light emitting layer and the sixth light emitting layer may be a blue light emitting layer.

In an embodiment, a thickness of the first light emitting layer may be greater than a thickness of the second light emitting layer, and the thickness of the second light emitting layer may be greater than a thickness of the fifth light emitting layer, and a thickness of the third light emitting layer may be greater than a thickness of the fourth light emitting layer and the thickness of the fourth light emitting layer may be greater than a thickness of the sixth light emitting layer.

In an embodiment, the fifth light emitting layer may be a layer that emits a first blue light having a first central wavelength, and the sixth light emitting layer may b a layer that emits a second blue light having a second central wavelength different from the first central wavelength.

In an embodiment, the charge generation unit may further include a buffer layer between the n-type charge generation layer and the p-type charge generation layer.

In an embodiment, the n-type charge generation layer may have a step difference and each of the first p-type charge generation layer and the second p-type charge generation layer may have no step difference.

In an embodiment, the first light emitting unit may further include: a first hole transport region below the first light emitting layer and the second light emitting layer, and on the first sub-electrode and the second sub-electrode; and a first electron transport region on the first light emitting layer and on the second light emitting layer and below the charge generation unit, wherein the second light emitting unit may further include: a second hole transport region below the third light emitting layer and the fourth light emitting layer, and on the charge generation unit; and a second electron transport region on the third light emitting layer and the fourth light emitting layer, and below the second electrode.

In an embodiment, the n-type charge generation layer may be doped with an inorganic material, and the p-type charge generation layer may be doped with an organic material or an inorganic material.

In an embodiment, the p-type charge generation layer may be doped with a metal halide.

In an embodiment, a thickness of the first p-type charge generation layer and a thickness of the second p-type charge generation layer may be different from each other.

In an embodiment, the n-type charge generation layer may include an n-type dopant and the p-type charge generation layer includes a p-type dopant, a doping ratio of the n-type dopant may be 1 wt % to 10 wt %, a doping ratio of the p-type dopant may be 2 wt % to 15 wt %, and the doping ratios of the p-type dopants in the first p-type charge generation layer and the second p-type charge generation layer may be different from each other.

In some example embodiments of the inventive concept, an organic electroluminescence display device includes: a substrate where a first light emitting region, a second light emitting region, and a third light emitting region spaced apart from each other are defined; a first electrode including a first sub-electrode on the substrate and corresponding to the first light emitting region; a second sub-electrode corresponding to the second light emitting region; and a third sub-electrode corresponding to the third light emitting region; a first light emitting unit including a first sub-light emitting layer on the first electrode and corresponding to the first light emitting region; a second sub-light emitting layer corresponding to the second light emitting region; and a third sub-light emitting layer corresponding to the third light emitting region, a charge generation unit on the first light emitting unit; a second light emitting unit including a fourth sub-light emitting layer corresponding to the first light emitting region; a fifth sub-light emitting layer corresponding to the second light emitting region; and a sixth sub-light emitting layer corresponding to the third light emitting region, and the second light emitting unit is on the charge generation unit; and a second electrode on the second light emitting unit, wherein the charge generation unit includes: an n-type charge generation layer commonly on the first light emitting region, the second light emitting region, and the third light emitting region; and a p-type charge generation layer including a first p-type charge generation layer corresponding to the first light emitting region; a second p-type charge generation layer corresponding to the second light emitting region; and a third p-type charge generation layer corresponding to the third light emitting region, and the p-type charge generation layer is on the n-type charge generation layer.

In an embodiment, the first p-type charge generation layer, the second p-type charge generation layer, and the third p-type charge generation layer may be spaced apart from each other.

In an embodiment, each of the first sub-light emitting layer and the fourth sub-light emitting layer may be a red light emitting layer, each of the second sub-light emitting layer and the fifth sub-light emitting layer may be a green light emitting layer, and each of the third sub-light emitting layer and the sixth sub-light emitting layer may be a blue light emitting layer.

In an embodiment, a thickness of the first sub-light emitting layer may be greater than a thickness of the second sub-light emitting layer, and the thickness of the second sub-light emitting layer may be greater than a thickness of the third light emitting layer, and a thickness of the fourth sub-light emitting layer may be greater than a thickness of the fifth sub-light emitting layer, and the thickness of the fifth sub-light emitting layer may be greater than a thickness of the sixth sub-light emitting layer.

In an embodiment, the charge generation unit may further include a buffer layer between the n-type charge generation layer and the p-type charge generation layer.

In an embodiment, the n-type charge generation layer may have a step difference, and each of the first p-type charge generation layer, the second p-type charge generation layer, and the third p-type charge generation layer may have no step difference.

In an embodiment, the n-type charge generation layer may be doped with an inorganic material, and the p-type charge generation layer may be doped with an organic material.

In an embodiment, a thickness of the first p-type charge generation layer, a thickness of the second p-type charge generation layer, and a thickness of the third p-type charge generation layer may be different from each other.

In an embodiment, the n-type charge generation layer may include an n-type dopant and the p-type charge generation layer includes a p-type dopant, a doping ratio of the n-type dopant may be 1 wt % to 10 wt %, a doping ratio of the p-type dopant may be 2 wt % to 15 wt %, and the doping ratios of the p-type dopants in the first p-type charge generation layer, the second p-type charge generation layer, and the third p-type charge generation layer may be different from each other.

BRIEF DESCRIPTION OF THE FIGURES

The accompanying drawings are included to provide a further understanding of the inventive concept, and are incorporated in and constitute a part of this specification. The drawings illustrate aspects of some example embodiments of the inventive concept and, together with the description, serve to explain some aspects of some example embodiments of the inventive concept. In the drawings.

DETAILED DESCRIPTION

Figure 1:
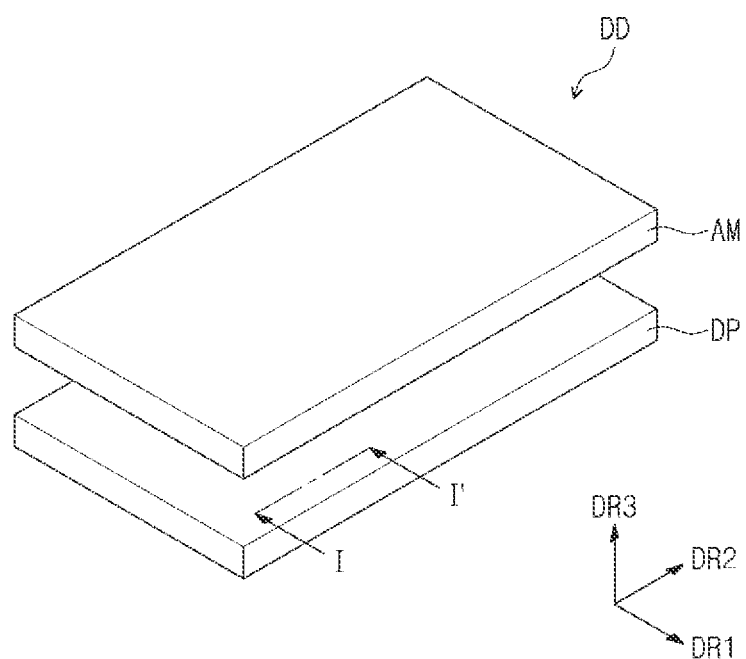
FIG. 1 is a perspective view of an organic electroluminescence display device according to some example embodiments of the inventive concept.

Aspects, features, and characteristics of some example embodiments of the inventive concept will be more easily understood through example embodiments relating to the accompanying drawings. The inventive concept may, however, be embodied in different forms and should not be construed as limited to the embodiments set forth herein. Rather, these embodiments are provided so that this disclosure will be more thorough and more complete, and will more fully convey the scope of some example embodiments of the inventive concept to those skilled in the art.

Like reference numerals refer to like elements throughout the drawings. In the accompanying drawings, the dimensions of structures are enlarged than they actually are for the clarity of the inventive concept. It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The singular expressions include plural expressions unless the context clearly dictates otherwise.

Additionally, in various embodiments of the inventive concept, the terms "include," "comprise," "including," or "comprising," specify a property, a region, a fixed number, a step, a process, an element and/or a component but do not exclude other properties, regions, fixed numbers, steps, processes, elements and/or components. Additionally, it will be understood that when a portion such as a layer, a film, an area, and a plate is referred to as being 'on' another portion, it can be directly on the other portion, or an intervening portion can also be present. On the other hand, it will be understood that when a portion such as a layer, a film, an area, and a plate is referred to as being 'below' another portion, it can be directly below the other portion, or an intervening portion can also be present.

On the other hand, "directly disposed" or "directly on" in the present application may mean that there is no layer, film, region, plate or the like added between the portion of the layer, film, region, plate or the like and another portion. For example, "directly disposed" or "directly on" may mean disposing without additional members such as adhesive members between two layers or two members.

Hereinafter, an organic electroluminescence display device according to some example embodiments of the inventive concept will be described with reference to the drawings.

FIG. 1 is a perspective view of an organic electroluminescence display device DD according to some example embodiments. Referring to FIG. 1, an organic electroluminescence display DD according to some example embodiments of the inventive concept includes an organic electroluminescence display panel DP and an additional member AM located on the organic electroluminescence display panel DP. The additional member AM may adopt a general one known in the art, for example, an input sensing unit, an optical member, a window member, and the like.

The input sensing unit may be one that recognizes a direct touch of a user, an indirect touch of a user, a direct touch of an object, or an indirect touch of an object. On the other hand, the input sensing unit may sense at least one of a position of a touch and a strength (pressure) of a touch, which are applied externally. The input sensing unit according to some example embodiments of the inventive concept may have various structures or may be composed of various materials. For example, in the display device DD according to some example embodiments, the input sensing unit may be a touch sensing unit that senses a touch.

The optical member may be to shield external light provided to the organic electroluminescence display panel DP from the outside. The optical member may be a polarizing member for blocking external light or a color filter member having a color filter layer. Example embodiments of the inventive concept are not limited thereto, but the organic electroluminescence display panel DP according to some example embodiments of the inventive concept may not include a separate color filter layer or color conversion layer.

The window member may protect the organic electroluminescence display panel DP from external forces. The image emitted from the organic electroluminescence display panel DP may be finally recognized by a user through the window member.

The top surfaces of the organic electroluminescence display panel DP and the additional member AM are parallel to the plane defined by a first directional axis DR1 and a second directional axis DR2. The thickness direction of the organic electroluminescence display DD is indicated by a third directional axis DR3. The upper side (or upper part) and the lower side (or lower part) of each of the members are separated by the third directional axis DR3. However, the directions indicated by the first to third directional axes DR1, DR2, DR3 may be converted to other directions as relative concepts. Hereinafter, first to third directions as directions that the respective first to third directional axes DR1, DR2, and DR3 indicate refer to the same reference numerals.

In this specification, "on a plane" may refer to an organic electroluminescence display device DD viewed in the third direction DR3.

Figure 2:
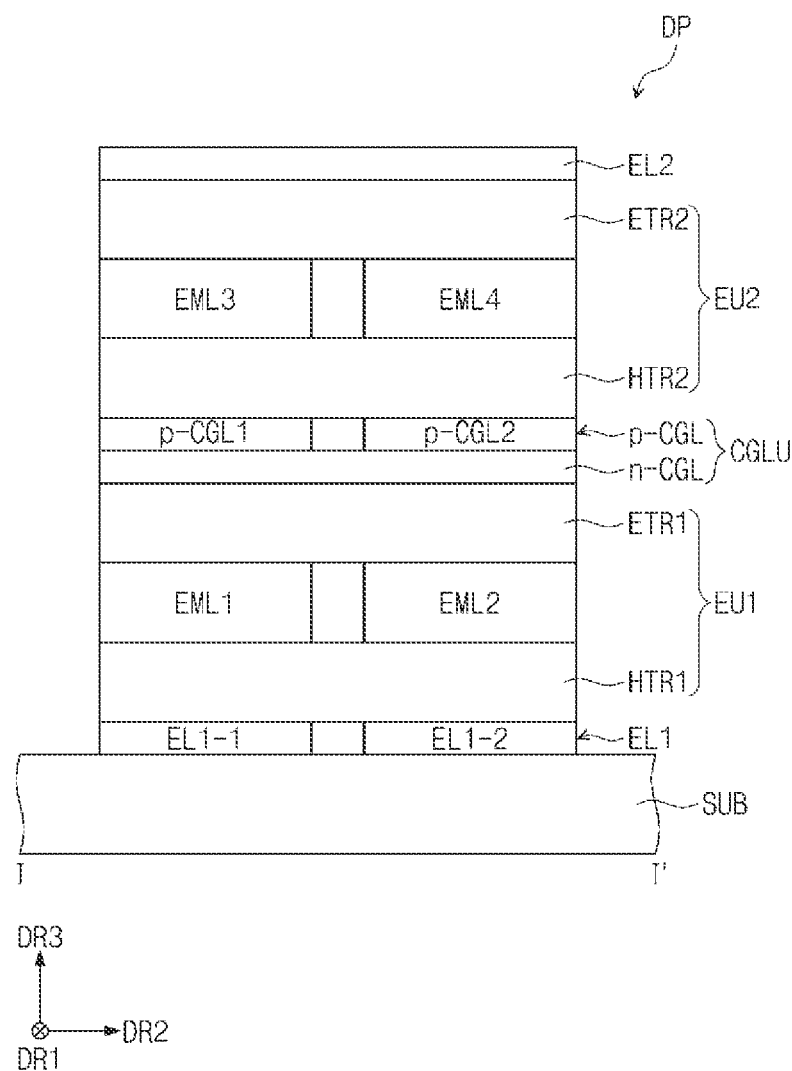
FIG. 2 is a cross-sectional view taken along a line I-I' of FIG. 1 according to some example embodiments of the inventive concept.

FIG. 2 is a cross-sectional view taken along a line I-I' of FIG. 1 according to some example embodiments. For example, FIG. 2 is a cross-section of a portion of an organic electroluminescence display panel DP. In FIG. 2, the cutting direction is parallel to the second direction DR2, for example, but is not limited thereto.

Referring to FIG. 2, the organic electroluminescence display panel DP includes a substrate SUB, a first electrode EL1 located on the substrate, a first light emitting unit EU1 located on the first electrode EL1, a charge generation unit CGLU located on the first light emitting unit EU1, a second light emitting unit EU2 located on the charge generation unit CGLU, and a second light emitting unit located on the second light emitting unit EU2. The organic electroluminescence display panel DP may include only two light emitting units EU1 and EU2 and one charge generation unit CGLU between the first electrode EL1 and the second electrode EL2.

The substrate SUB may be a glass substrate, a metal substrate, a plastic substrate, or the like, although it is not particularly limited as long as it is commonly used. The substrate SUB may be a layer made of, for example, an organic polymer. Examples of the organic polymer for forming the substrate SUB include polyethylene terephthalate (PET), polyethylene naphthalate (PEN), polyimide, polyether sulfone, and the like. The substrate SUB may be selected in consideration of mechanical strength, thermal stability, transparency, surface smoothness, ease of handling, and waterproofness.

The first electrode EL1 may be, for example, a pixel electrode, or an anode. The first electrode EL1 may be a reflective electrode, but the embodiment is not limited thereto. For example, the first electrode EL1 may be a transmissive electrode or a semi-transmissive electrode. If the first electrode EL1 is a semi-transmissive electrode or a reflective electrode, it may be formed of Ag, Mg, Cu, Al, Pt, Pd, Au, Ni, Nd, Ir, Cr, Li, Ca, LiF/Ca, LiF/Al, Mo, Ti, a compound thereof, or a mixture (for example, a mixture of Ag and Mg). Alternatively, it may have a multilayer structure including a reflective layer or a semi-transmissive layer formed of the material, and a transparent conductive layer formed of indium tin oxide (ITO), indium zinc oxide (IZO), zinc oxide (ZnO), and indium tin zinc oxide (ITZO).

The first electrode EL1 includes a plurality of sub-electrodes (e.g., EL1-1, EL2-2) spaced apart from each other on the substrate SUB.

The first light emitting unit EU1 may include a plurality of light emitting layers located to be spaced apart from each other. For example, the first light emitting unit EU1 may include a first light emitting layer EML1 located correspondingly on the first sub-electrode EL1-1 and a second light emitting layer EML2 located correspondingly on the second light emitting layer EL1-2. The first light emitting layer EML1 and the second light emitting layer EML2 are located apart from each other.

The first light emitting layer EML1 does not overlap with the second sub-electrode EL1-2 on a plane, and the second light emitting layer EML2 does not overlap with the first sub-electrode EL1-1 on a plane.

The first light emitting unit EU1 may further include a first electrode EU and a first hole transport region HTR1 located between the plurality of light emitting layers. The first hole transport region HTR1 may be commonly located on the first sub-electrode EL1-1 and the second sub-electrode EL1-2, and may be commonly located under the first light emitting layer EML1 and the second light emitting layer EML2.

The first hole transport region HTR1 may adopt any conventional configuration known in the art without limitation.

The first hole transport region HTR1 may have a single layer made of a single material, a single layer made of a plurality of different materials, or a multi-layered structure having a plurality of layers made of a plurality of different materials.

The first hole transport region HTR1 may have a structure of a single layer made of a plurality of different materials or may have a structure of a hole injection layer/a hole transport layer, a hole injection layer/a hole transport layer/a hole buffer layer, a hole injection layer/a hole buffer layer, a hole transport layer/a hole buffer layer, or a hole injection layer/a hole transport layer/an electron blocking layer, which are sequentially stacked from the first electrode EL1. However, example embodiments are not limited thereto.

The first hole transport region HTR1 may be formed using any suitable method. For example, the first hole transport region HTR1 may be formed using various methods such as a vacuum deposition method, spin coating, casting, Langmuir-Blodgett, inkjet printing, laser printing, laser induced thermal imaging (LITI), and the like.

When the first hole transport region HTR1 includes a hole injection layer, it may include a phthalocyanine compound such as copper phthalocyanine, DNTPD (N,N'-diphenyl-N, N'-bis-[4-(phenyl-m-tolyl-amino)-phenyl]-biphenyl-4,4'-diamine), m-MTDATA(4,4',4"-tris(3-methylphenylphenylamino)triphenylamine), TDATA(4,4'4"-Tris(N,N-diphenylamino)triphenylamine), 2TNATA(4,4',4"-tris{N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS((Polyaniline)/Poly(4-styrenesulfonate)), and the like, but is not limited thereto.

When the first hole transport region HTR1 includes a hole transport layer, it may be a carbazole-based derivative such as N-phenylcarbazole or polyvinylcarbazole, a fluorene-based derivative, TPD(N,N'-bis(3-methylphenyl)-N,N'-diphenyl-[1,1-biphenyl]-4,4'-diamine), a triphenylamine derivative such as TCTA(4,4',4"-tris(N-carbazolyl)triphenylamine), NPB(N,N'-di(1-naphthyl)-N,N'-diphenylbenzidine), TAPC(4,4'-Cyclohexylidene bis[N,N-bis(4-methylphenyl)benzenamine]), and the like, but is not limited thereto.

The thickness of the first hole transport region HTR1 may be, for example, from about 100 Å to about 10,000 Å, for example, from about 100 Å to about 1000 Å. When the first hole transport region HTR1 includes both the hole injection layer and the hole transport layer, the thickness of the hole injection layer is about 100 Å to about 10,000 Å, for example, about 100 Å to about 1000 Å, and the thickness of the hole transport layer may be about 50 Å to about 2000 Å, for example, about 100 Å to about 1500 Å. When the thickness of the first hole transport region HTR1, the hole injection layer, and the hole transport layer satisfies the above-described ranges, satisfactory hole transport characteristics may be obtained without substantial increase in driving voltage.

The first hole transport region HTR1 may further include a charge generation material for improving the conductivity, in addition to the above-mentioned materials. The charge generation material may be uniformly or non-uniformly dispersed within the first hole transport region HTR1. The charge generation material may be, for example, a p-dopant. The p-dopant may be one of quinone derivatives, metal oxides, and cyano group-containing compounds but is not limited thereto. For example, non-limiting examples of the p-dopant include quinone derivatives such as TCNQ (tetracyanoquinodimethane) and F4-TCNQ (2,3,4,6-tetrafluorotetracyanoquinodimethane), metal oxides such as tungsten oxide and molybdenum oxide, and the like but are not limited thereto.

As described above, the first hole transport region HTR1 may further include at least one of a hole buffer layer and an electron blocking layer in addition to a hole injection layer and a hole transport layer.

The first light emitting unit EU1 may further include a first electron transport region ETR1 located between the plurality of light emitting layers and the charge generation unit CGLU. The first electron transport region ETR1 is commonly located on the first light emitting layer EML1 and the second light emitting layer EML2 and is located under the charge generation unit CGLU.

The first electronic transport region ETR1 may utilize any configuration known in the art without limitation.

The first electron transport region ETR1 may include at least one of a hole blocking layer, an electron transport layer, and an electron injection layer, but is not limited thereto.

When the first electron transport region ETR1 includes an electron transport layer, it may include Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(berylliumbis(benzoquinolin-10-olate)), ADN(9,10-di(naphthalene-2-yl)anthracene), and a mixture thereof, but is not limited thereto. The thickness of the electron transport layer may be about 100 Å to about 1000 Å, for example about 150 Å to about 500 Å. When the thickness of the electron transport layer satisfies the above-described range, a satisfactory degree of electron transport characteristics may be obtained without a substantial increase in driving voltage.

When the first electron transport region ETR1 includes an electron injection layer, it may use a lanthanum metal such as LiF, LiQ, Li2O, BaO, NaCl, CsF, Yb, or metal halides such as RbCl and RbI, but is not limited thereto. The electron injection layer may also be made of a mixture of an electron transport material and an insulating organo metal salt. The organo metal salt may be a material having an energy band gap of about 4 eV or more. For example, the organo metal salt may include a metal acetate, a metal benzoate, a metal acetoacetate, a metal acetylacetonate, or a metal stearate. The thickness of the electron injection layer may be about 1 Å to about 100 Å, for example, about 3 Å to about 90 Å. When the thickness of the electron injection layer satisfies the above-described range, satisfactory electron injection characteristics may be obtained without substantial increase in driving voltage.

The first electron transport region ETR1 may include a hole blocking layer, as mentioned above. The hole blocking layer may include at least one of BCP(2,9-dimethyl-4,7-diphenyl-1,10-phenanthroline) and Bphen(4,7-diphenyl-1,10-phenanthroline), but is not limited thereto.

The charge generation unit CGLU is located between the first light emitting unit EU1 and the second light emitting unit EU2 to adjust the charge balance between the first light emitting unit EU1 and the second light emitting unit EU2.

The charge generation unit CGLU includes an n-type charge generation layer n-CGL located adjacent to the first light emitting unit EU1 and a p-type charge generation layer p-CGL located adjacent to the second light emitting unit EU2.

The n-type charge generation layer n-CGL is located on the first light emitting layer EML1 and the second light emitting layer EML2. The n-type charge generation layer n-CGL is located on the first sub-electrode EL1-1 and the second sub-electrode EL1-2. The n-type charge generation layer n-CGL overlaps both the first light emitting layer EML1 and the second light emitting layer EML2 on a plane. The n-type charge generation layer n-CGL overlaps both the first sub-electrode EL1-1 and the second sub-electrode EL1-2 on a plane.

The n-type charge generation layer n-CGL may serve to supply electrons to the first light emitting unit EU1.

The p-type charge generation layer p-CGL includes a plurality of sub-charge generation layers located on the n-type charge generation layer n-CGL and spaced apart from each other. For example, the p-type charge generation layer p-CGL includes a first p-type charge generation layer p-CGL1 located correspondingly on the first light emitting layer EML1, and a second p-type charge generation layer p-CGL2 located correspondingly on the second light emitting layer EML2. The first p-type charge generation layer p-CGL1 and the second p-type charge generation layer p-CGL2 are located apart from each other.

The first p-type charge generation layer p-CGL1 does not overlap with the second sub-electrode EL1-2 on a plane. The first p-type charge generation layer p-CGL1 does not overlap with the second light emitting layer EML2 on a plane.

The second p-type charge generation layer p-CGL2 does not overlap with the first sub-electrode EL1-1 on a plane. The second p-type charge generation layer p-CGL2 does not overlap with the first light emitting layer EML1 on a plane.

The p-type charge generation layer p-CGL may serve to provide holes to the second light emitting unit EU2.

The second light emitting unit EU2 may include a plurality of light emitting layers located to be spaced apart from each other. For example, the second light emitting unit EU2 may include a third light emitting layer EML3 located correspondingly on the first light emitting layer EML1, and a fourth light emitting layer EML4 located correspondingly on the second light emitting layer EML2. The third light emitting layer EML3 and the fourth light emitting layer EML4 are located apart from each other.

The third light emitting layer EML3 does not overlap with the second sub-electrode EL1-2 on a plane, and the fourth light emitting layer EML4 does not overlap with the first sub-electrode EL1-1 on a plane. The third light emitting layer EML3 does not overlap with the second sub-electrode EL1-2 on a plane, and the fourth light emitting layer EML4 does not overlap with the first sub-electrode EL1-1 on a plane.

The second light emitting unit EU2 may further include a second hole transport region HTR2 located between the charge generation unit CGLU and the plurality of light emitting layers. The second hole transport region HTR2 may be located on the charge generation unit CGLU, and may be commonly located under the third light emitting layer EML3 and the fourth light emitting layer EML4.

The description of the second hole transport region HTR2 may be equally applied to the description of the first hole transport region HTR1. The first hole transport region HTR1 and the second hole transport region HTR2 are the same or different from each other.

The second light emitting unit EU2 may further include a second electron transport region ETR2 located between the plurality of light emitting layers and the second electrode EL2. The second electron transport region ETR2 is commonly located on the third light emitting layer EML3 and the fourth light emitting layer EML4, and is located under the second electrode EL2.

The description of the second electron transport region ETR2 may be applied equally to the above-mentioned description of the first electron transport region ETR1 described above, so that a detailed description thereof will be omitted. The first electron transport region ETR1 and the second electron transport region ETR2 are the same or different from each other.

The first light emitting layer EML1 and the second light emitting layer EML2 may be layers that emit different colors from each other. For example, one of the first light emitting layer EML1 and the second light emitting layer EML2 is a layer that emits blue light, and the other layer is a layer that emits white light that is mixed with blue light. However, the inventive concept is not limited thereto. For example, the first light emitting layer EML1 may be a red light emitting layer and the second light emitting layer EML2 may be a green light emitting layer.

The third light emitting layer EML3 and the fourth light emitting layer EML4 may be layers that emit different colors from each other. For example, one of the third light emitting layer EML3 and the fourth light emitting layer EML4 is a layer that emits blue light, and the other layer is a layer that emits white light that is mixed with blue light. However, the inventive concept is not limited thereto. For example, the third light emitting layer EML3 may be a red light emitting layer and the fourth light emitting layer EML4 may be a green light emitting layer.

The first light emitting layer EML1 and the third light emitting layer EML3 may be a layer emitting the same color, and the second light emitting layer EML2 and the fourth light emitting layer EML4 may be layers emitting the same color. That is, the light emitting layers emitting light of the same color may be stacked in the thickness direction DR3.

Figure 3:
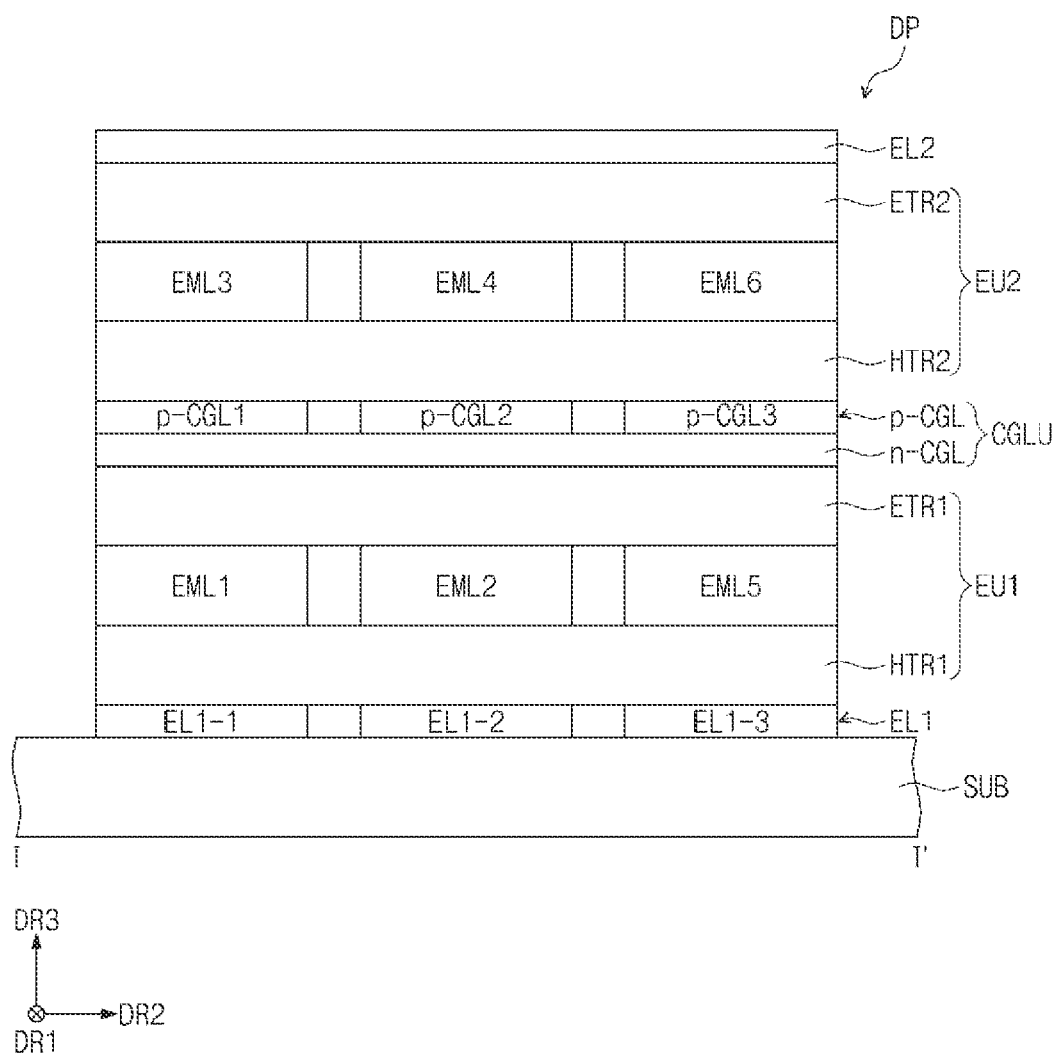
FIG. 3 is a cross-sectional view taken along a line I-I' of FIG. 1 according to some example embodiments of the inventive concept.

FIG. 3 is a cross-sectional view taken along a line I-I' of FIG. 1 according to some example embodiments.

Referring to FIG. 3, the first electrode EL1 may further include a third sub-electrode EL1-3. The third sub-electrode EL1-3 is located on the substrate SUB apart from the first sub-electrode EL1-1 and the second sub-electrode EL1-2.

The first light emitting unit EU1 may further include a fifth light emitting layer EML5 located correspondingly on the third sub-electrode EL1-3. The fifth light emitting layer EML5 does not overlap with the first sub-electrode EL1-1 and the second sub-electrode EL1-2 on a plane. The fifth light emitting layer EML5 is located apart from the first light emitting layer EML1 and the second light emitting layer EML2.

The second light emitting unit EU2 may further include a sixth light emitting layer EML6 located correspondingly on the fifth light emitting layer EML5. The sixth light emitting layer EML6 does not overlap with the first sub-electrode EL1-1 and the second sub-electrode EL1-2 on a plane. The sixth light emitting layer EML6 does not overlap with the first light emitting layer EML1 and the second light emitting layer EML2 on a plane. The sixth light emitting layer EML6 is located apart from the third light emitting layer EML3 and the fourth light emitting layer EML4.

The p-type charge generation layer p-CGL may further include a third p-type charge generation layer p-CGL3 located correspondingly on the fifth light emitting layer EML5. The third p-type charge generation layer p-CGL3 is located apart from the first p-type charge generation layer p-CGL1 and the second p-type charge generation layer p-CGL2. The third p-type charge generation layer p-CGL3 does not overlap with the first sub-electrode EL1-1 and the second sub-electrode EL1-2 on a plane. The third p-type charge generation layer p-CGL3 does not overlap with the first light emitting layer EML1 and the second light emitting layer EML2 on a plane.

The fifth light emitting layer EML5 and the sixth light emitting layer EML6 may be layers that emit different colors from each other. The fifth light emitting layer EML5 may be a layer emitting a different color from each of the first light emitting layer EML1 and the second light emitting layer EML2. The sixth light emitting layer EML6 may be a layer emitting a different color from each of the third light emitting layer EML3 and the fourth light emitting layer EML5.

The inventive concept is not limited thereto. Each of the first light emitting layer EML1 and the third light emitting layer EML3 is a red light emitting layer. Each of the second light emitting layer EML2 and the fourth light emitting layer EML4 is a green light emitting layer. Each of the fifth light emitting layer EML5 and the sixth light emitting layer EML6 may be a blue light emitting layer.

The fifth light emitting layer EML5 may be a layer that emits a first blue light having a first central wavelength, and the sixth light emitting layer EML6 may be a layer that emits a second blue light having a second central wavelength different from the first center wavelength. For example, one of the fifth light emitting layer EML5 and the sixth light emitting layer EML6 may be a layer that emits blue light having a wavelength region of 440 nm or more and less than 460 nm, and the other one may be a layer that emits blue light having a wavelength region of 460 nm or more and 490 nm or less. For example, one of the fifth light emitting layer EML5 and the sixth light emitting layer EML6 may be a layer that emits deep blue, and the other may be a layer that emits sky blue. By applying two blue light emitting layers having different central wavelengths, blue emission peaks may be broadly distributed, thereby improving color visibility at a side viewing angle. However, example embodiments of the inventive concept are not limited thereto, and the fifth light emitting layer EML5 and the sixth light emitting layer EML6 may be layers that emit the same blue light.

Figure 4:
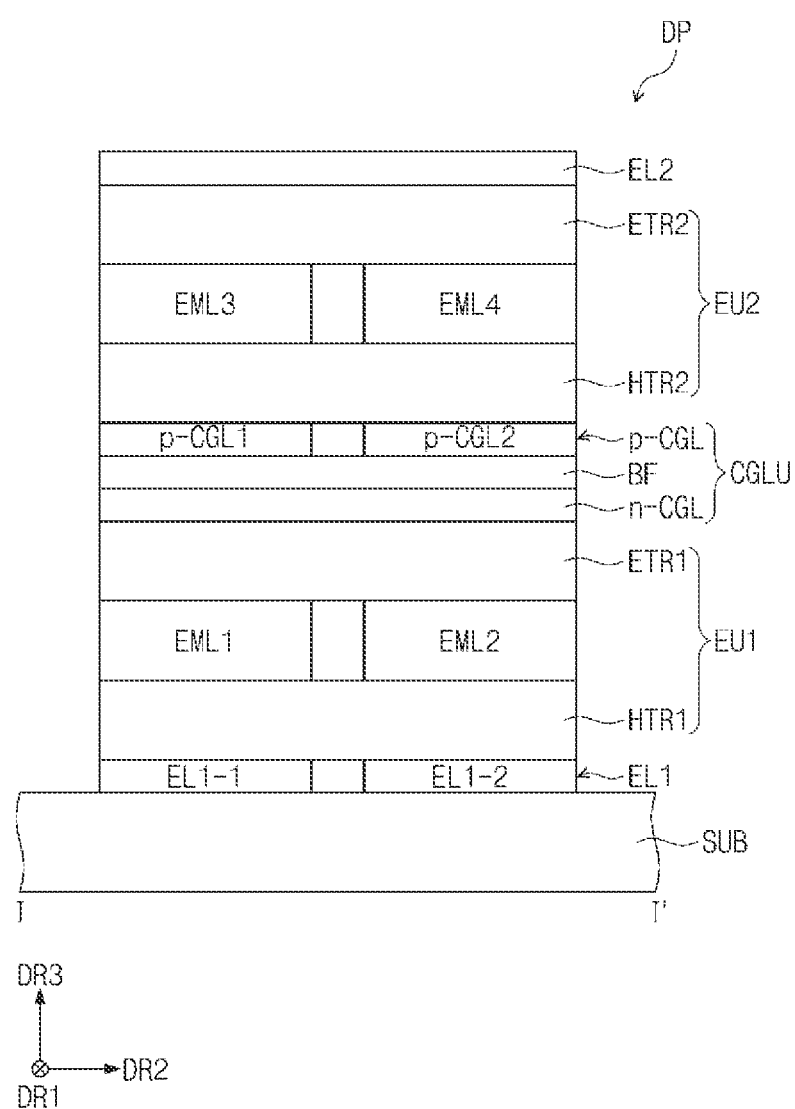
FIG. 4 is a cross-sectional view taken along a line I-I' of FIG. 1 according to some example embodiments of the inventive concept.

FIG. 4 is a cross-sectional view taken along a line I-I' of FIG. 1 according to some example embodiments.

Referring to FIG. 4, the charge generation unit CGLU may further include a buffer layer BF located between an n-type charge generation layer n-CGL and a p-type charge generation layer p-CGL. The buffer layer BF overlaps the first sub-electrode EL1-1 and the second sub-electrode EL1-2 on a plane. The buffer layer BF overlaps the first light emitting layer EML1 and the second light emitting layer EML2 on a plane. The buffer layer BF may be an insulating layer. The buffer layer BF may be a layer that prevents some of the material of the p-type charge generation layer p-CGL from being transferred to the n-type charge generation layer n-CGL. However, example embodiments of the inventive concept are not limited thereto, and the n-type charge generation layer n-CGL and the p-type charge generation layer p-CGL may be in contact with each other.

The buffer layer BF may comprise an organic material and/or an inorganic material. The inventive concept is not limited thereto, and the buffer layer BF may include C60, CuPc, Alq3, Bphen, NPB, or the like.

Figure 5:
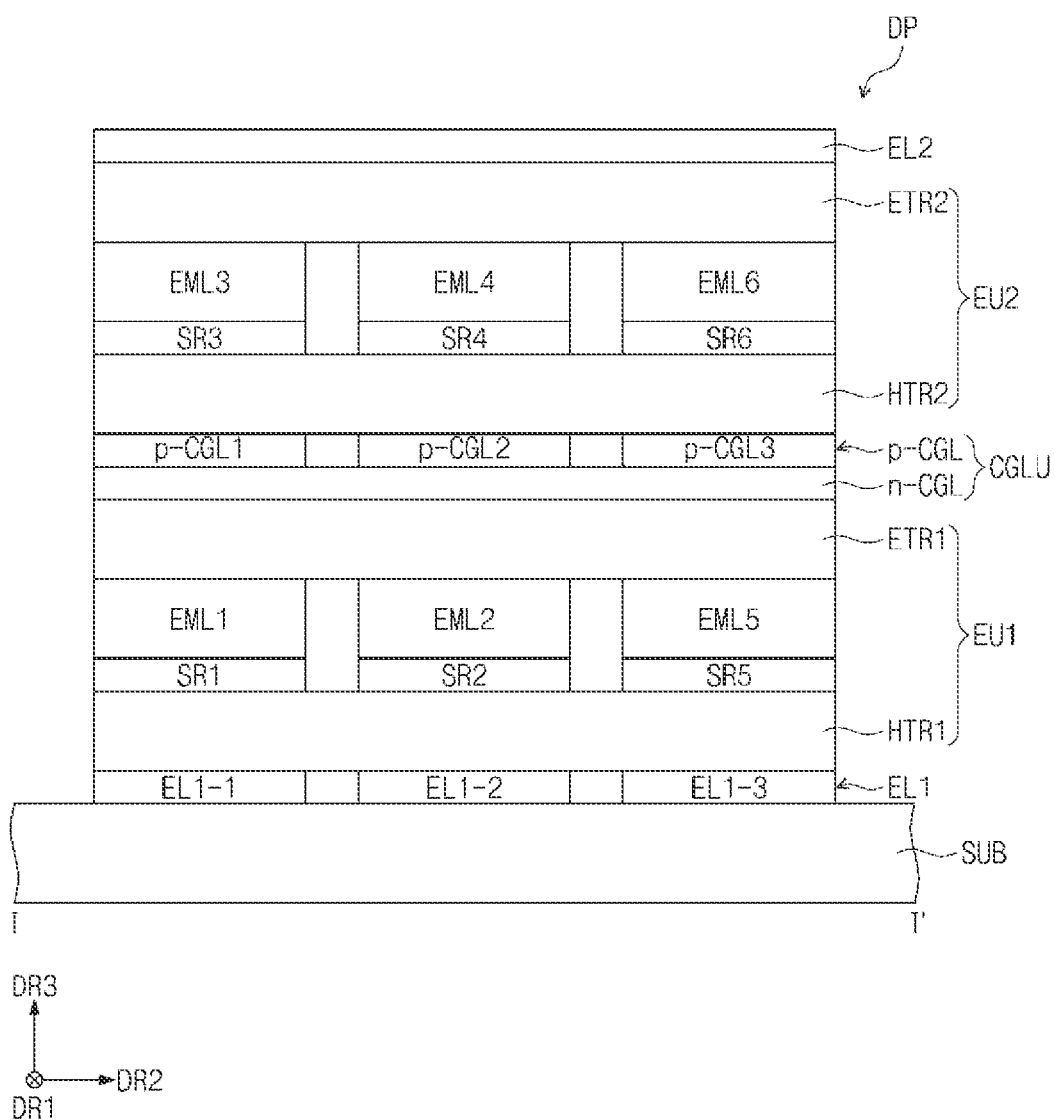
FIG. 5 is a cross-sectional view taken along a line I-I' of FIG. 1 according to some example embodiments of the inventive concept.

FIG. 5 is a cross-sectional view taken along a line I-I' of FIG. 1 according to some example embodiments.

Referring to FIG. 5, the organic electroluminescence display panel DP may further include a plurality of light-emitting auxiliary layers. For example, the first light emitting unit EU1 may include a first light-emitting auxiliary layer SR1 and a second light-emitting auxiliary layer SR2 located apart from each other on the first hole transport region HTR1. The first light-emitting auxiliary layer SR1 may be located between the first hole transporting region HTR1 and the first light emitting layer EML1, and the second light-emitting auxiliary layer SR2 may be located between the first hole transporting region HTR1 and the second light emitting layer EML2. If the first light emitting unit EU1 includes a fifth light emitting layer EML5, it may further include a fifth light-emitting auxiliary layer SR5 located between the first hole transporting region HTR1 and the fifth light emitting layer EML5. The fifth light-emitting auxiliary layer SR5 is located on the first hole transporting region HTR1 apart from each of the first light-emitting auxiliary layer SR1 and the second light-emitting auxiliary layer SR2.

The second light emitting unit EU2 may further include a plurality of light-emitting auxiliary layers. For example, the second light emitting unit EU2 may include a third light-emitting auxiliary layer SR3 and a fourth light-emitting auxiliary layer SR4 located apart from each other on the second hole transporting region HTR2. A third light-emitting auxiliary layer SR3 may be located between the second hole transporting region HTR2 and the third light emitting layer EML3, and a fourth light-emitting auxiliary layer SR4 may be located between the second hole transporting region HTR2 and the fourth light emitting layer EML4. If the second light emitting unit EU2 includes a sixth light emitting layer EML6, it may further include a sixth light-emitting auxiliary layer SR6 located between the second hole transporting region HTR2 and the sixth light emitting layer EML6. The sixth light-emitting auxiliary layer SR6 is located on the second hole transporting region HTR2 apart from each of the third light-emitting auxiliary layer SR3 and the fourth light-emitting auxiliary layer SR4.

It is described in FIG. 5 that the first through sixth light-emitting auxiliary layers SRI, SR2, SR3, SR4, SR5, and SR6 have the same thickness. However, example embodiments of the inventive concept is not limited thereto. Each may have a different thickness. For example, the thickness of the first light-emitting auxiliary layer SR1 is greater than the thickness of the second light-emitting auxiliary layer SR2 and the thickness of the second light-emitting auxiliary layer SR2 may be greater than the thickness of the fifth light-emitting auxiliary layer SRS. For example, the thickness of the third light-emitting auxiliary layer SR3 is greater than the thickness of the fourth light-emitting auxiliary layer SR4 and the thickness of the fourth light-emitting auxiliary layer SR4 may be greater than the thickness of the sixth light-emitting auxiliary layer SR6.

Figure 6:
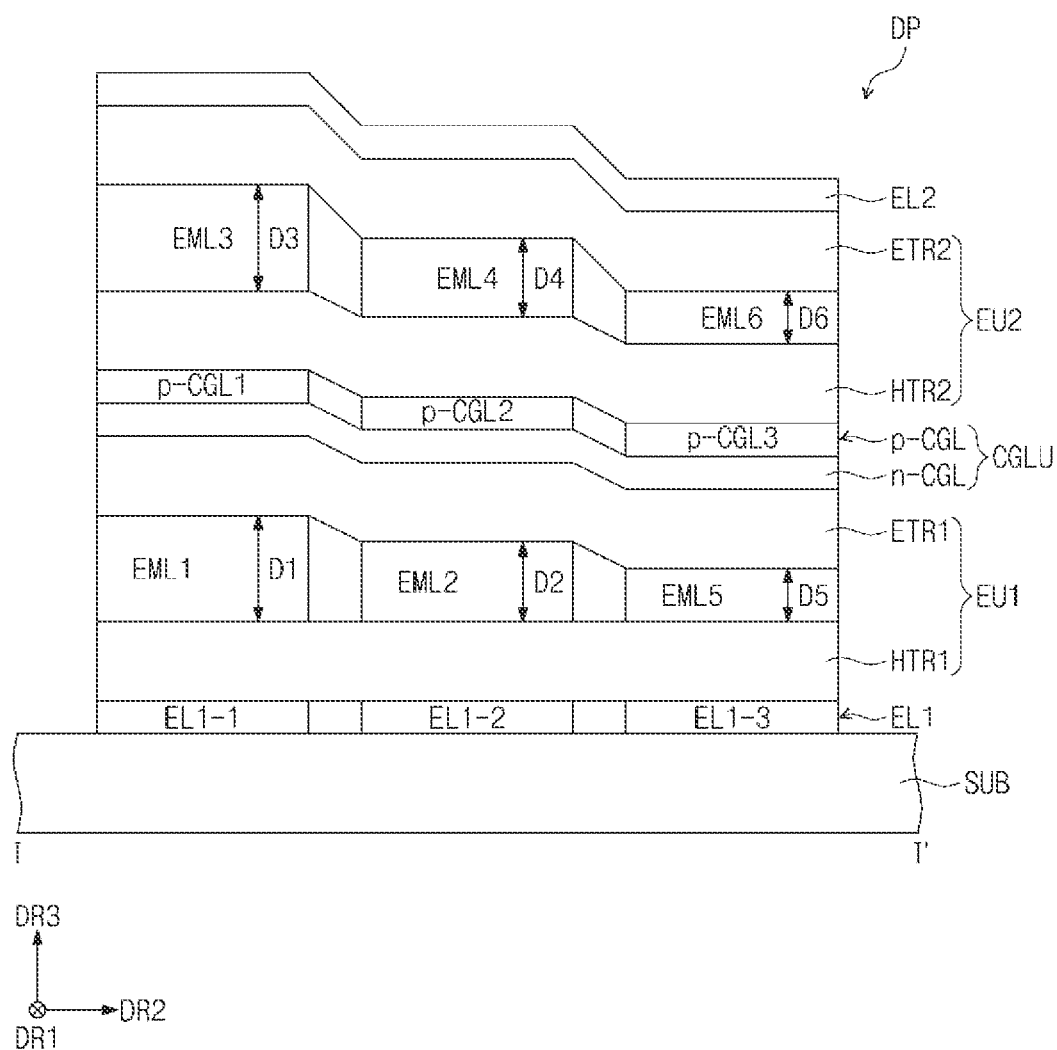
FIG. 6 is a cross-sectional view taken along a line I-I' of FIG. 1 according to some example embodiments of the inventive concept.

FIG. 6 is a cross-sectional view taken along a line I-I' of FIG. 1 according to some example embodiments.

Referring to FIG. 6, the plurality of light emitting layers of the first light emitting unit EU1 may have different thicknesses from each other. For example, the thickness D1 of the first light emitting layer EML1 may be thicker than the thickness D2 of the second light emitting layer EML2. The thickness of the second light emitting layer EML2 may be thicker than the thickness D5 of the fifth light emitting layer EML5. The first light emitting layer EML1 may be a red light emitting layer. The second light emitting layer EML2 may be a green light emitting layer. The fifth light emitting layer EML5 may be a blue light emitting layer.

As the first light emitting layer EML1, the second light emitting layer EML2, and the fifth light emitting layer EML5 have different thicknesses from each other, the charge generation unit CGLU, the second light emitting unit EU2, and the second electrode EL2 located on the upper portion may have a step difference. For example, the n-type charge generation layer n-CGL may have a stepped structure, and the first p-type charge generation layer p-CGL1, the second p-type charge generation layer p-CGL2, and the third p-type charge generation layer p-CGL3 may not have a stepped structure.

The plurality of light emitting layers of the second light emitting unit EU2 may also have different thicknesses from each other. For example, the thickness D3 of the third light emitting layer EML3 may be thicker than the thickness D4 of the fourth light emitting layer EML4. The thickness D4 of the fourth light emitting layer EML4 may be thicker than the thickness D6 of the sixth light emitting layer EML6. The third light emitting layer EML3 may be a red light emitting layer. The fourth light emitting layer EML4 may be a green light emitting layer. The sixth light emitting layer EML6 may be a blue light emitting layer.

The thickness D1 of the first light emitting layer EML1 and the thickness D3 of the third light emitting layer EML3 may be 20 Å or more to 550 Å or less, respectively. The thickness D2 of the second light emitting layer EML2 and the thickness D4 of the fourth light emitting layer EML4 may be 20 Å or more to 300 Å or less, respectively. The thickness D5 of the fifth light emitting layer EML5 and the thickness D6 of the sixth light emitting layer EML6 may be 20 Å or more to 280 Å or less, respectively.

Figure 7:
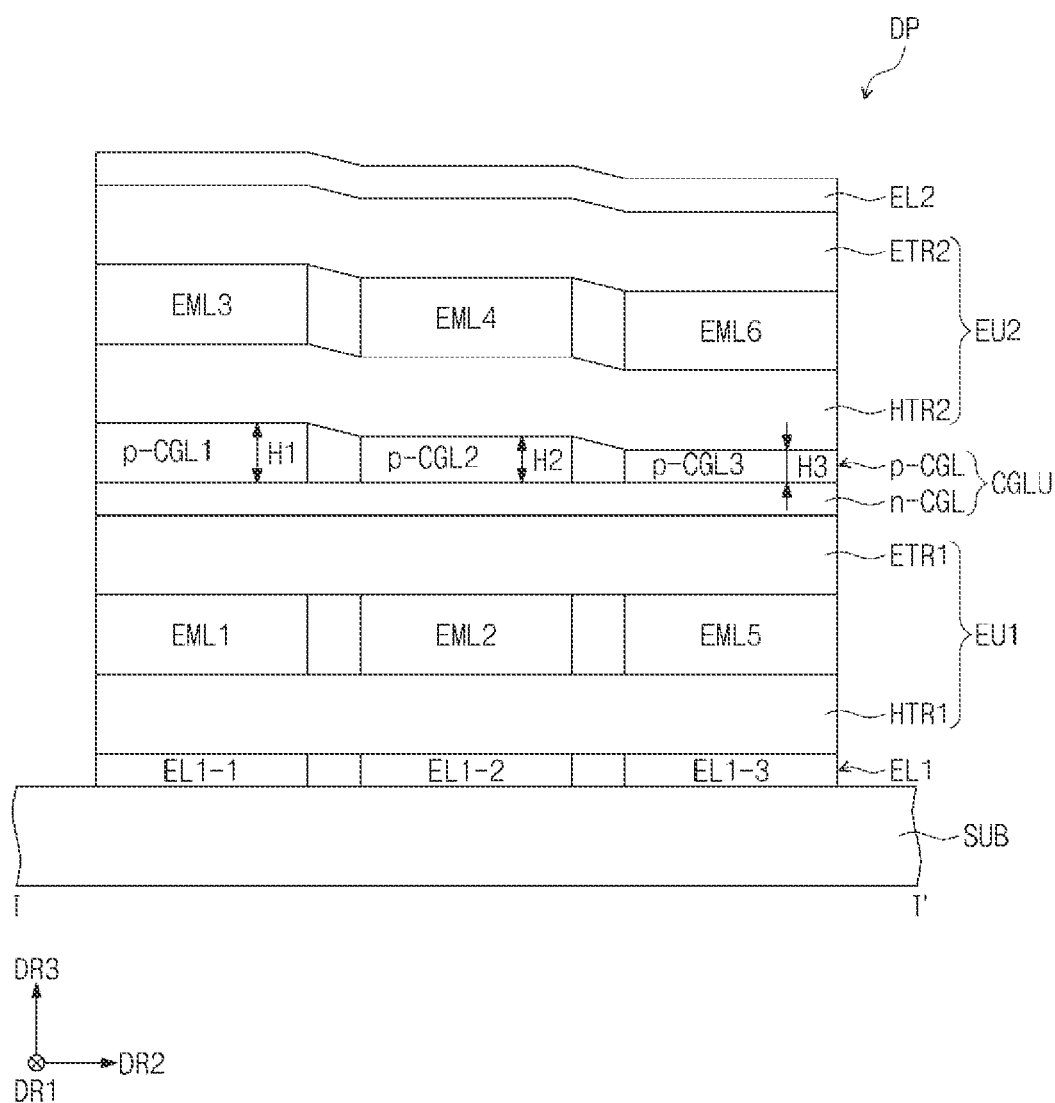
FIG. 7 is a cross-sectional view taken along a line I-I' of FIG. 1 according to some example embodiments of the inventive concept.

FIG. 7 is a cross-sectional view taken along a line I-I' of FIG. 1 according to some example embodiments.

Referring to FIG. 7, in order to adjust the luminous efficiency of the corresponding light emitting layer, the first p-type charge generation layer p-CGL1, the second p-type charge generation layer p-CGL2, and the third p-type charge generation layer p-CGL3 may have different thicknesses. For example, the thickness H1 of the first p-type charge generation layer p-CGL1 may be larger than the thickness H2 of the second p-type charge generation layer p-CGL2, and the thickness H2 of the second p-type charge generation layer p-CGL2 may be larger than the thickness H3 of the third p-type charge generation layer p-CGL3. However, the thickness relationship is not limited thereto.

The thickness of the n-type charge generation layer n-CGL may be, for example, 50 Å or more to 300 Å or less and the thickness of the p-type charge generation layer p-CGL may be 50 Å or more to 200 Å or less.

The n-type charge generation layer n-CGL may be a single layer of an n-type material, or may be a layer doped with an n-type dopant in an electron transport material which is a matrix. The electron transport material may adopt any material known in the art without limitation and may be selected from examples of materials of the first electron transport region ETR1 described above. The n-type charge generation layer n-CGL may be layer that includes the same material as any one of the electron transport layer or the electron injection layer of the first electron transport region (ETR1) as a matrix and is doped with an n-type dopant.

When the n-type charge generation layer n-CGL includes an n-type dopant, the doping ratio of the n-type dopant to the total weight of the n-type charge generation layer n-CGL may be 1 wt % or more and 10 wt % or less, or 2 wt % or more and 5 wt % or less.

The p-type charge generation layer p-CGL may be a single layer of a p-type material, or may be a layer doped with a p-type dopant in a hole transport material which is a matrix. The hole transport material may adopt any material known in the art without limitation and may be selected from examples of materials of the first hole transport region ETR1 described above. The p-type charge generation layer p-CGL may be a layer that includes the same material as any one of the hole injection layer and the hole transport layer of the first hole transporting region HTR1 as a matrix and is doped with a p-type dopant.

When the p-type charge generation layer p-CGL includes a p-type dopant, the doping ratio of the p-type dopant to the total weight of the p-type charge generation layer p-CGL may be 2 wt % or more and 15 wt % or less. By adjusting the thicknesses of the first p-type charge generation layer p-CGL1, the second p-type charge generation layer p-CGL2, and the third p-type charge generation layer p-CGL3 to be the same and the doping ratios to be different from each other, emitting efficiency of the corresponding light emitting layer may be adjusted.

However, example embodiments of the inventive concept are not limited thereto, and the n-type charge generation layer n-CGL may be doped with an inorganic material, and the p-type charge generation layer p-CGL may be doped with an organic material or an inorganic material. For example, the n-type charge generation layer n-CGL may be doped with Yb and the p-type charge generation layer p-CGL may be doped with an organic compound containing a cyano group and a fluorine atom. For example, the n-type charge generation layer n-CGL may be doped with Yb and the p-type charge generation layer p-CGL may be doped with an organic compound containing a cyano group, a fluorine atom and cyclopropane in one molecule. However, the inventive concept is not limited thereto. For example, the p-type charge generation layer p-CGL may also be doped with an inorganic material and may be doped with at least one of WO3, MoO3, and VOx. The p-type charge generation layer p-CGL may be doped with a metal halide, for example, CuI, AgI, BiI3, ZrI4, or MnI2. The p-type charge generation layer p-CGL may be doped with CuI.

Figure 8:
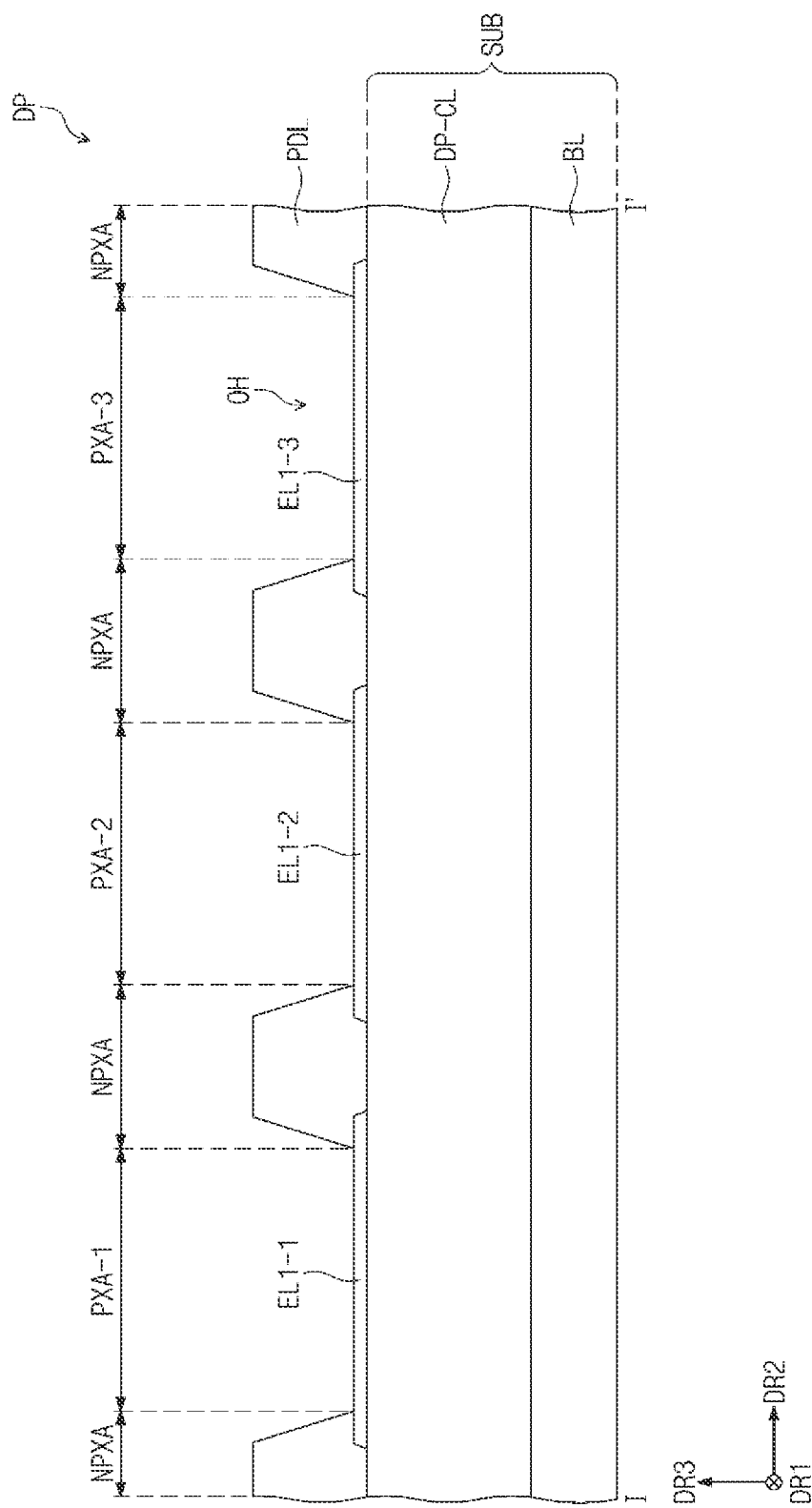
FIG. 8 is a schematic cross-sectional view taken along a line I-I' of FIG. 1 according to some example embodiments of the inventive concept.

FIG. 8 is a schematic cross-sectional view taken along a line I-I' of FIG. 1 according to some example embodiments. FIG. 8 is a cross-sectional view that a configuration on the first electrodes EL1-1, EL1-2, and EL1-3 are omitted from the section taken along the line I-I' of FIG. 1.

Referring to FIG. 8, the organic electroluminescence display panel DP may include a non-light emitting region NPXA and light emitting regions PXA-1, PXA-2, and PXA-3. Each of the light emitting regions PXA-1, PXA-2, and PXA-3 may be a region in which light generated from the first light emitting unit EU1 and the second light emitting unit EU2 is emitted.

A pixel defining layer PDL may be located on a part of each of the first sub-electrodes EL1-1, EL1-2, and EL1-3 and on the substrate SUB. The pixel defining layer PDL may be partitioned to correspond to each of the light emitting regions PXA-1, PXA-2, and PXA-3. The pixel defining layer PDL may be located corresponding to the non-light emitting region NPXA.

The pixel defining layer PDL may be formed of a polymer resin. For example, the pixel defining layer PDL may include a polyacrylate resin or a polyimide resin. In addition, the pixel defining layer PDL may be formed by further including an inorganic material in addition to the polymer resin. On the other hand, the pixel defining layer PDL may be formed to include a light absorbing material, or may include a black pigment or a black dye. The pixel defining layer PDL formed with a black pigment or a black dye may implement a black pixel defining layer. In forming the pixel defining layer PDL, black pigment or carbon black may be used as the black dye, but the embodiment is not limited thereto.

In addition, the pixel defining layer PDL may be formed of an inorganic material. For example, the pixel defining layer PDL may be formed of silicon nitride (SiNx), silicon oxide (SiOx), silicon oxynitride (SiOxNy), or the like.

The substrate SUB may include a base layer BL and a circuit layer DP-CL located on the base layer BL. A first light emitting region PXA-1, a second light emitting region PXA-2, and a third light emitting region PXA-3, which are spaced apart from each other, may be defined on the substrate SUB.

The base layer BL may be a glass substrate, a metal substrate, a plastic substrate, or the like. The base layer BL may be an inorganic layer or an organic layer or a composite layer. A more detailed description of the circuit layer DP-CL will be given later.

Referring to FIGS. 2 to 8, the first sub-electrode EL1-1 may be located corresponding to the first light emitting region PXA-1. The second sub-electrode EL1-2 may be located corresponding to the second light emitting region PXA-2. The third sub-electrodes EL1-3 may be located corresponding to the third light emitting region PXA-3.

Each of the first electron transport region HTR1, the first electron transport region ETR1, the second hole transport region HTR2, and the second electron transport region ETR2 may be commonly located in the non-light emitting region NPXA and the third light emitting regions PXA-1, PXA-2, and PXA-3. The upper surface of each of the first sub-electrodes EL1-1, EL1-2 and EL1-3 is partially exposed by an opening OH defined in the pixel defining layer PDL, and the first hole transport region HTR1, the first electron transport region ETR1, the second hole transport region HTR2, and the second electron transport region ETR2 are commonly located on the upper portion of the pixel defining layer PDL and in the opening OH. In other words, the first hole transport region HTR1, the first electron transport region ETR1, the second hole transport region HTR2, and the second electron transport region ETR2 may be arranged integrally without distinguishing the non-light emitting region NPXA and the light emitting regions PXA-1, PXA-2, and PXA-3.

The second electrode EL2 may be commonly located in the non-light emitting region NPXA and the first to third light emitting regions PXA-1, PXA-2, and PXA-3. However, the inventive concept is not limited thereto. Although not shown in the drawing, the second electrode EL2 may include a plurality of sub-electrodes located corresponding to the light emitting regions PXA-1, PXA-2, and PXA-3, respectively.

The n-type charge generation layer n-CGL is a layer that is commonly located in the non-light emitting region NPXA and the first to third light emitting regions PXA-1, PXA-2, and PXA-3. A portion of the n-type charge generation layer n-CGL may be located on the pixel defining layer PDL.

The p-type charge generation layer p-CGL is a layer that is not located in the non-light emitting region NPXA. The p-type charge generation layer p-CGL includes a first p-type charge generation layer p-CGL1 arranged corresponding to the first light emitting region PXA-1, a second p-type charge generation layer p-CGL2 arranged corresponding to the second light emitting region PXA-2, and a third p-type charge generation layer p-CGL3 arranged corresponding to the third light emitting region PXA-3, and is not located on the pixel defining layer PDL.

The first to sixth light emitting layers EML6 are layers not located in the non-light emitting region NPXA such as the p-type charge generation layer p-CGL, and are not located on the pixel defining layer PDL. For example, the first light emitting layer EML1 may be located on the upper surface of the first sub-electrode EL1-1 exposed by the opening OH defined in the pixel defining layer PDL. The second light emitting layer EML2 is located on the upper surface of the second sub-electrode EL1-2 exposed by the opening OH. The fifth light emitting layer EML5 may be located on the upper surface of the third sub-electrode EL1-3 exposed by the opening OH.

It is described as an example in FIG. 8 that the areas of the first to third light emitting regions PXA-1, PXA-2, and PXA-3 are the same, but the inventive concept is not limited thereto. For example, the first light emitting region PXA-1 and the third light emitting region PXA-3 may have a larger area than the second light emitting region PXA-2.

Figure 9:
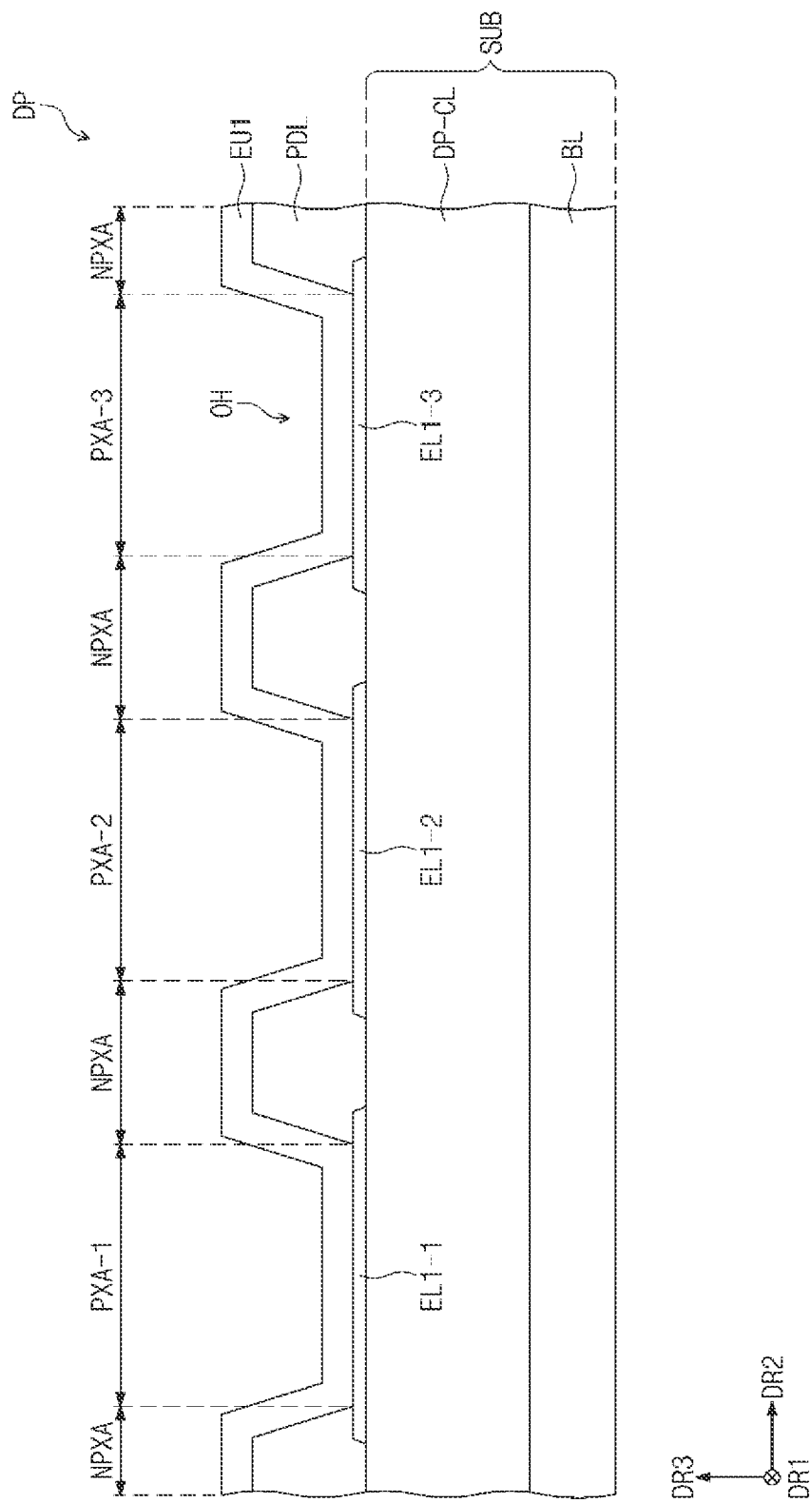
FIGS. 9 to 11 are cross-sectional views sequentially illustrating a method of manufacturing a charge generation unit included in an organic electroluminescence display device according to some example embodiments of the inventive concept.
Figure 10:
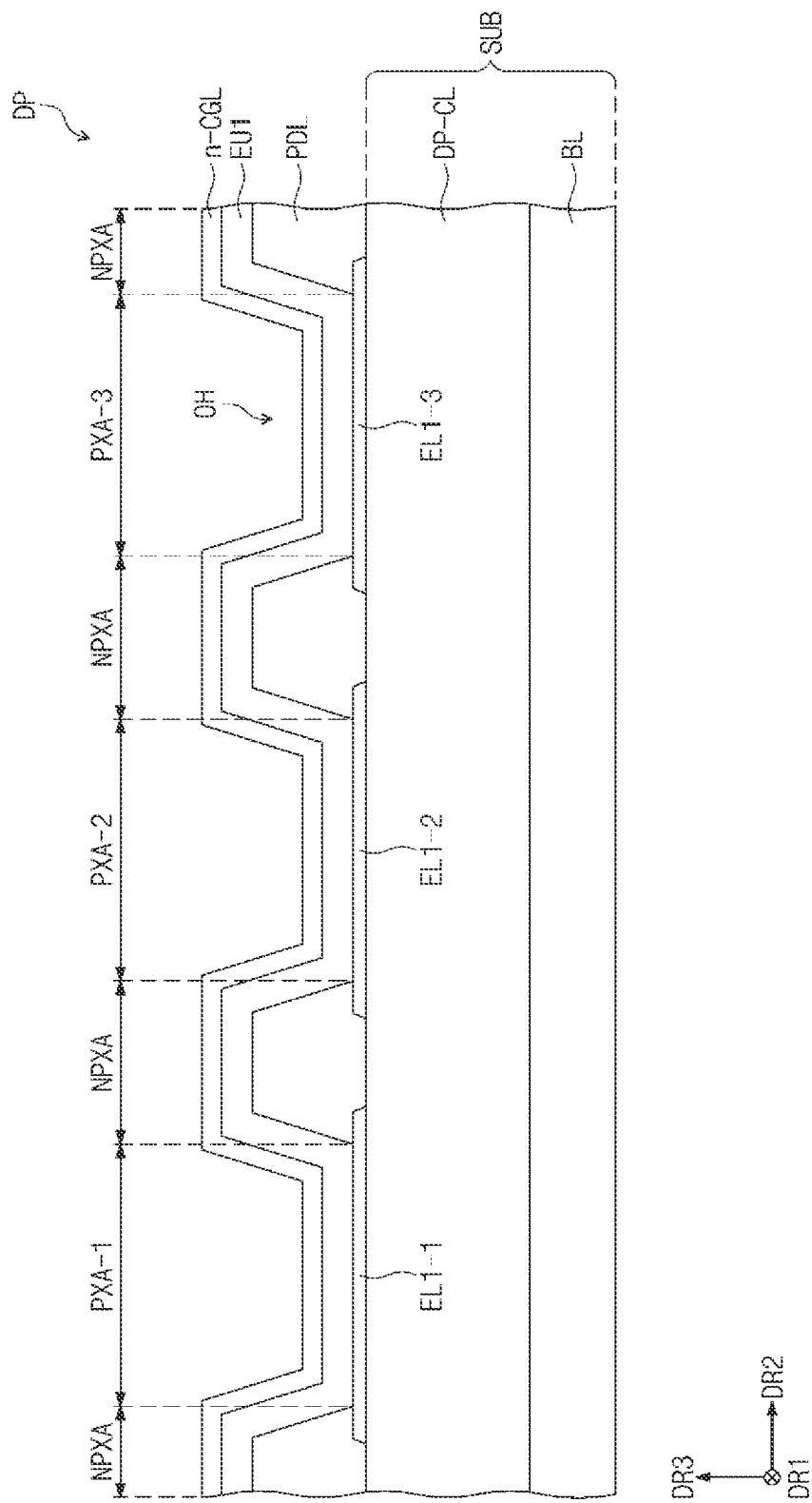
Figure 11:
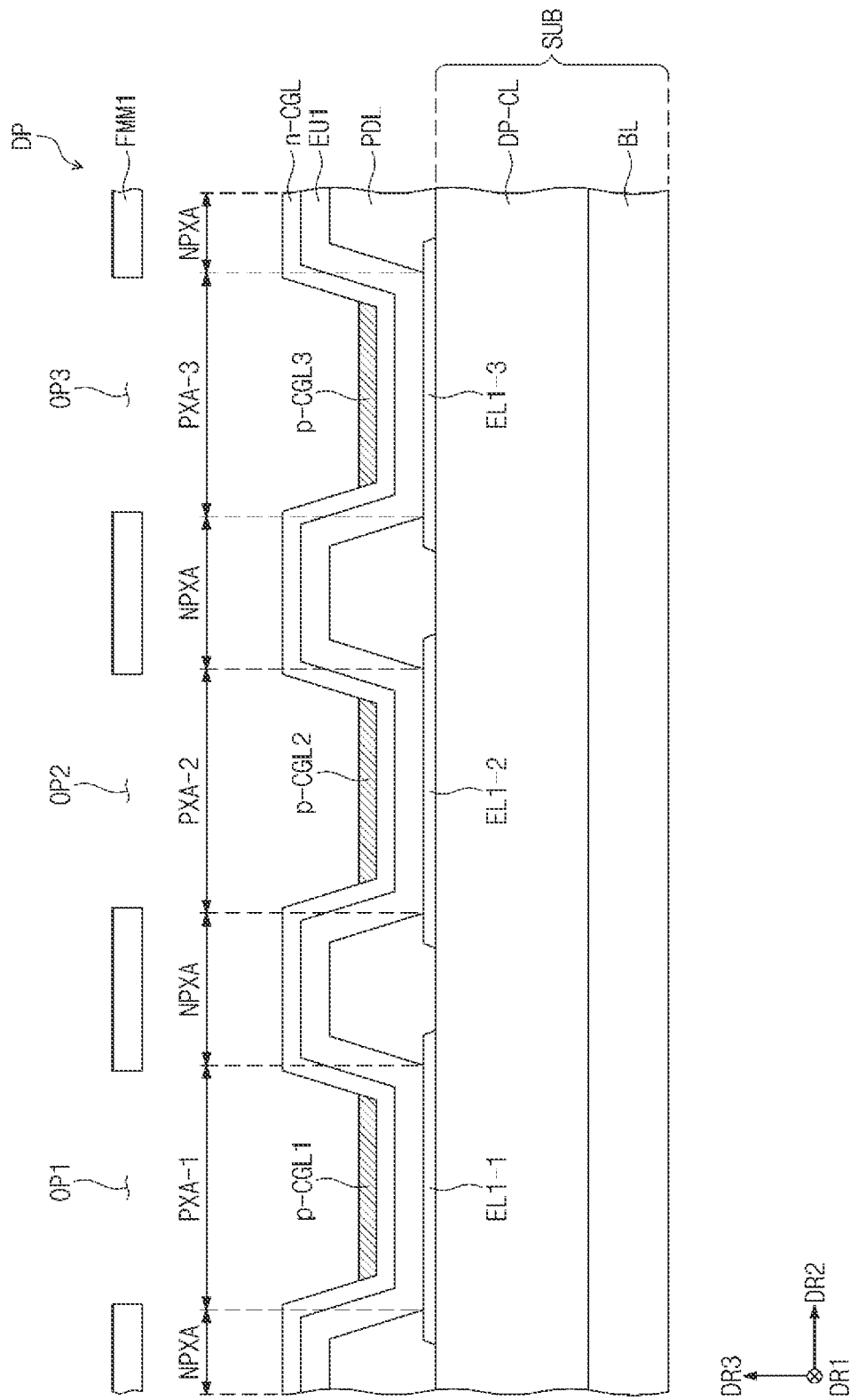

FIGS. 9 to 11 are cross-sectional views sequentially illustrating a method of manufacturing a charge generation unit included in an organic electroluminescence display device according to some example embodiments of the inventive concept.

Referring to FIG. 9, after the first to third sub-electrodes EL1-1, EL1-2, and EL1-3, which are spaced apart from each other, are formed first on the substrate SUB including the base layer BL and the circuit layer DP-CL, the pixel defining layer PDL is formed, so that the non-light emitting region NPXA and the first to third light emitting regions PXA-1, PXA-2, and PXA-3 are defined on the substrate SUB. Then, the first light emitting unit EU1 is formed over the non-light emitting region NPXA and the first to third light emitting regions PXA-1, PXA-2 and PXA-3. The method of forming the first light emitting unit EU1 may adopt a general method known in the art without limitation. The outermost layer of the first light emitting unit EU1 is formed over the non-light emitting region NPXA and the first to third light emitting regions PXA-1, PXA-2, and PXA-3. For convenience of explanation, it is illustrated that the first light emitting unit EU1 is formed as a common layer. However, the first light emitting layer EML1 (see, e.g., FIG. 3), the second light emitting layer EML2 (see, e.g., FIG. 3), and the fifth light emitting layer EML5 (see, e.g., FIG. 3) may be formed only at the corresponding position of the opening OH.

Next, referring to FIG. 10, an n-type charge generation layer n-CGL is formed on the first light emitting unit EU1. The n-type charge generation layer n-CGL is a layer that is formed over the non-light emitting region NPXA and the first to third light emitting regions PXA-1, PXA-2, and PXA-3.

Next, referring to FIG. 11, a p-type charge generation layer p-CGL is formed on the n-type charge generation layer n-CGL. The p-type charge generation layer p-CGL may be formed using a first mask FMM1 having a plurality of openings OP1, OP2 and OP3. The first mask FMM1 may be, for example, a fine metal mask.

The first opening OP1 corresponding to the first light emitting region PXA-1, the second opening OP2 corresponding to the second light emitting region PXA-2, and the third opening OP3 corresponding to the third opening PXA-3 are defined in the first mask FMM1. The p-type charge generation layer p-CGL is patterned and formed only in regions corresponding to the first to third openings OP1, OP2, and OP3. Specifically, the first p-type charge generation layer p-CGL1 is formed only in the region corresponding to the first opening OP1. The second p-type charge generation layer p-CGL2 is formed only in the region corresponding to the second opening OP2. The third p-type charge generation layer p-CGL3 is formed only in the region corresponding to the third opening OP3.

That is, the forming of the charge generation unit CGLU includes forming the n-type charge generation layer n-CGL to be performed without using a mask, and forming the p-type charge generation layer p-CGL to be performed using the first mask FMM1.

Figure 12:
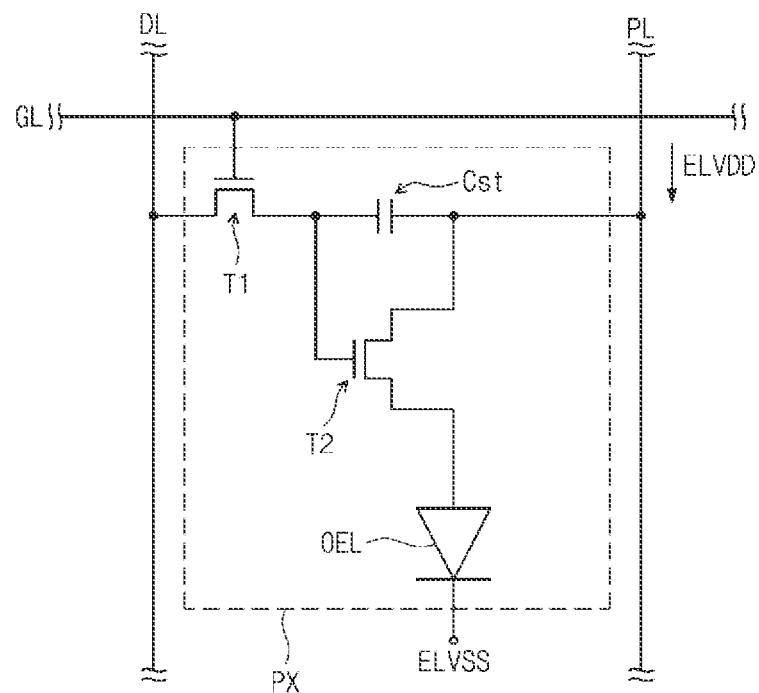
FIG. 12 is an equivalent circuit diagram of a pixel according to some example embodiments of the inventive concept.
Figure 13:
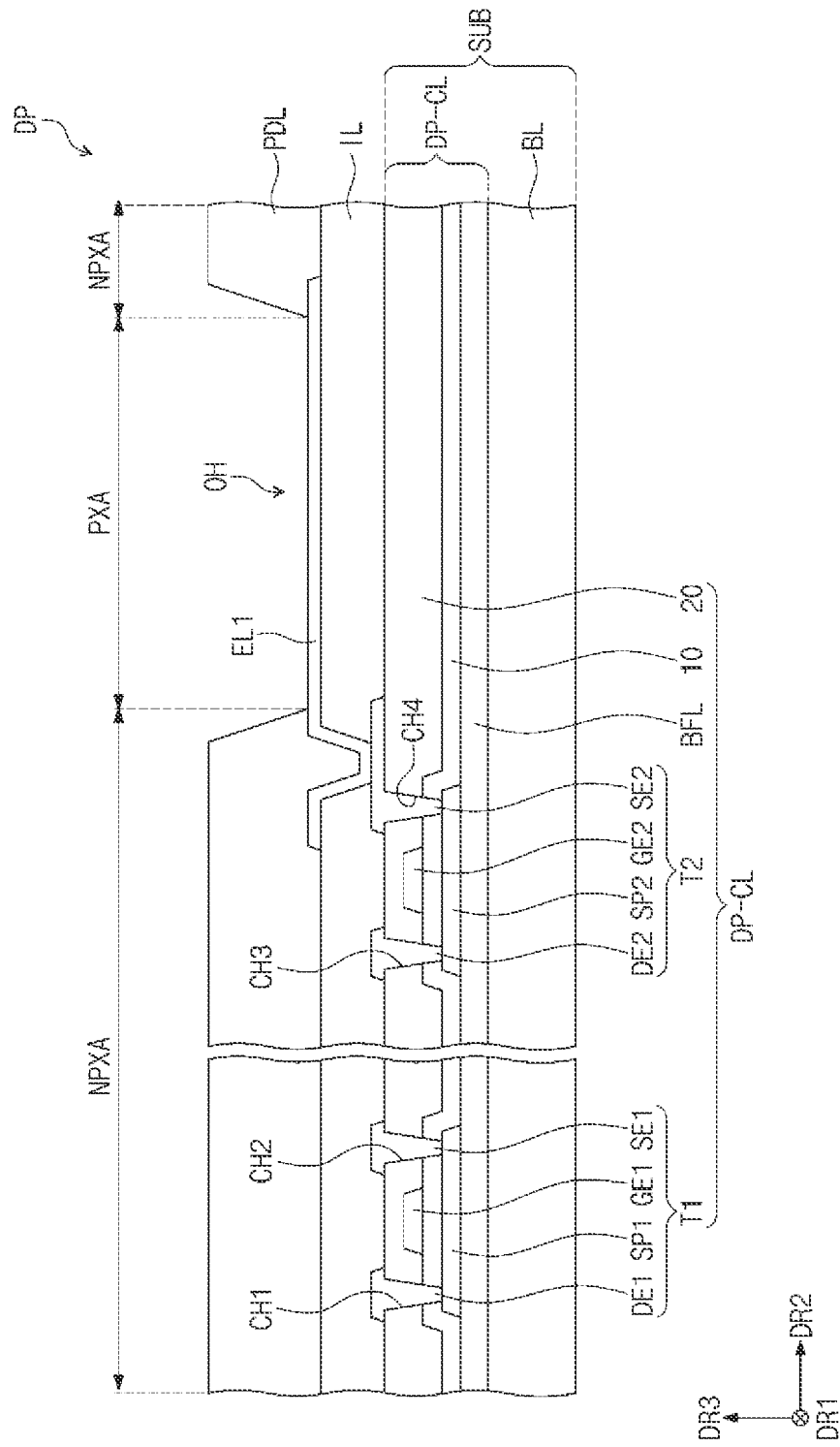
FIG. 13 is a cross-sectional view of a display panel according to some example embodiments of the inventive concept.

FIG. 12 is an equivalent circuit diagram of a pixel according to some example embodiments of the inventive concept. FIG. 13 is a cross-sectional view of a display panel according to some example embodiments of the inventive concept.

FIG. 12 shows a scan line GL, a data line DL, a power supply line PL, and a pixel PX connected thereto. On the other hand, the configuration of the pixel PX is not limited to that shown in FIG. 12 but may be modified and implemented.

The pixel PX includes a first transistor T1 (or a switching transistor), a second transistor T2 (or a driving transistor), and a capacitor Cst as a pixel driving circuit for driving the organic electroluminescence element OEL. The first power source voltage ELVDD is supplied to the second transistor T2 and the second power source voltage ELVSS is supplied to the organic electroluminescence element OEL. The second voltage ELVSS may have a lower level than the first voltage ELVDD. The organic electroluminescence device OEL includes the first electrode EL1 (see, e.g., FIG. 2), the first light emitting unit EU1 (see, e.g., FIG. 2), the charge generation unit CGLU (see, e.g., FIG. 2), the second light emitting unit EU2 (see, e.g., FIG. 2), and the second electrode EL2 (see, e.g., FIG. 2).

The first transistor T1 outputs a data signal applied to the data line DL in response to a scan signal applied to the scan line GL. The capacitor Cst charges a voltage corresponding to a data signal received from the first transistor T1. The second transistor T2 is connected to the organic electroluminescence element OEL. The second transistor T2 controls a driving current flowing through the organic electroluminescence element OEL in correspondence to a charge amount stored in the capacitor Cst.

The equivalent circuit is only an embodiment and is not limited thereto. The pixel PX may further include a plurality of transistors, and may include a larger number of capacitors. The organic electroluminescence element OEL may be connected between the power supply line PL and the second transistor T2.

FIG. 13 is a partial cross-sectional view of an organic electroluminescence display panel DP in an embodiment corresponding to the equivalent circuit shown in FIG. 12. The organic electroluminescence display panel DP includes a substrate SUB including a circuit layer DP-CL, an insulating layer IL located on the substrate SUB, a first electrode EL1 and a pixel defining layer PDL located on the insulating layer IL. In FIG. 13, for convenience of explanation, components arranged on the first electrode EL1 are omitted and shown.

The circuit layer DP-CL is located on the base layer BL, and may include a buffer film BFL which is an inorganic film. The buffer film BFL may prevent diffusion of impurities to the first and second transistors T1 and T2. The buffer film BFL may be formed of silicon nitride (SiNx), silicon oxide (SiOx), silicon oxynitride (SiOxNy), or the like. On the other hand, the buffer film BFL may be omitted depending on the material and the process conditions of the base layer BL.

A semiconductor pattern SP1 (hereinafter referred to as a first semiconductor pattern) of the first transistor T1 and a semiconductor pattern SP2 (hereinafter referred to as a second semiconductor pattern) of the second transistor T2 may be located on the buffer film BFL. The first semiconductor pattern SP1 and the second semiconductor pattern SP2 may be selected from amorphous silicon, poly silicon, or a metal oxide semiconductor.

A first intermediate inorganic film 10 may be located on the first semiconductor pattern SP1 and the second semiconductor pattern SP2. A control electrode GE1 (hereinafter referred to as a first control electrode) of the first transistor T1 and a control electrode GE2 (hereinafter referred to as a second control electrode) of the second transistor T2 may be located on the first intermediate inorganic film 10. The first control electrode GE1 and the second control electrode GE2 may be manufactured by the same photolithography process as the scan lines GL.

The second intermediate inorganic film 20 covering the first control electrode GE1 and the second control electrode GE2 may be located on the first intermediate inorganic film 10. An input electrode DE1 (hereinafter referred to as a first input electrode) and an output electrode SE1 (hereinafter referred to as a first output electrode) of the first transistor T1 and an input electrode DE2 (hereinafter referred to as a second input electrode) and an output electrode SE2 (hereinafter referred to as a second output electrode) of the second transistor T2 may be located on the second intermediate inorganic film 20.

The first input electrode DE1 and the first output electrode SE1 are connected to the first semiconductor pattern SP1 through the first contact hole CH1 and the second contact hole CH2 penetrating the first intermediate inorganic film 10 and the second intermediate inorganic film 20. The second input electrode DE2 and the second output electrode SE2 are electrically connected to the second semiconductor pattern SP2 through the third contact hole CH3 and the fourth contact hole CH4 penetrating the first intermediate inorganic film 10 and the second intermediate inorganic film 20. On the other hand, according to another embodiment of the inventive concept, some of the first transistor T1 and the second transistor T2 may be modified as a bottom gate structure and implemented.

An insulating layer IL may be located on the substrate SUB including the circuit layer DP-CL. An insulating layer IL covering the first input electrode DE1, the second input electrode DE2, the first output electrode SE1, and the second output electrode SE2 may be located on the second intermediate inorganic film 20. A hole may be defined in the insulating layer IL. In addition, the insulating layer IL may provide a flat surface to the circuit layer DP-CL at portions other than the holes. The insulating layer IL may be an organic film. For example, the insulating layer IL may be formed including polyimide or the like. The hole defined in the insulating layer IL may be a via hole penetrating an insulating layer. The first electrode EL1 and the pixel defining layer PDL may be located on the insulating layer IL, and a light emitting region PXA may be defined by a pixel defining layer PDL. One pixel PX (see FIG. 12) may be located in one light emitting region PXA, but is not limited thereto.

Referring again to FIGS. 2 to 8, an organic electroluminescence display panel (DP) according to some example embodiments will be described in more detail.

The organic electroluminescence display panel DP includes a first electrode EL1, a first light emitting unit EU1, a charge generation unit CGLU, a second light emitting unit EU2, and a second electrode EL2. A first light emitting region PXA-1, a second light emitting region PXA-2, and a third light emitting region PXA-3, which are spaced apart from each other, are defined on the substrate SUB.

A first electrode EL1 is located on the substrate SUB. The first electrode EL1 includes first sub-electrode EL1-1 arranged corresponding to the first light emitting region PXA-1, a second sub-electrode EL1-2 arranged corresponding to the second light emitting region PXA-2, and a third sub-electrode EL1-3 located corresponding to the third light emitting region PXA-3.

A first light emitting unit EU1 is located on the first electrode EL1. The first light emitting unit EU1 includes a first sub-light emitting layer EML1 arranged corresponding to the first light emitting region PXA-1, a second sub-light emitting layer EML2 arranged corresponding to the second light emitting region PXA-2, and a third sub-light emitting layer EML5 arranged corresponding to the third light emitting region PXA-3.

A charge generation unit CGLU is located on the first light emitting unit EU1. The charge generation unit CGLU includes an n-type charge generation layer n-CGL commonly located in the first light emitting region PXA-1, the second light emitting region PXA-2, and the third light emitting region PXA-3. The n-type charge generation layer n-CGL is also arranged in a non-light emitting region NPXA. The charge generation unit CGLU is located on the n-type charge generation layer n-CGL and includes a p-type charge generation layer p-CGL including a first p-type charge generation layer p-CGL1 arranged corresponding to the first light emitting region PXA-1, a second p-type charge generation layer p-CGL2 arranged corresponding to the second light emitting region PXA-2, and a third p-type charge generation layer p-CGL3 arranged corresponding to the third light emitting region PXA-3.

A second light emitting unit EU2 is located on the charge generation unit CGLU. The second light emitting unit EU2 includes a fourth sub-light emitting layer EML3 arranged corresponding to the first light emitting region PXA-1, a fifth sub-light emitting layer EML4 arranged corresponding to the second light emitting region PXA-2, and a sixth sub-light emitting layer EML6 arranged corresponding to the third light emitting region PXA-3.

Unless otherwise noted, a detailed description of the first electrode EL1, the first light emitting unit EU1, the charge generation unit CGLU, the second light emitting unit EU2, and the second electrode EL2 is omitted because the above description is applied identically.

The description of the first light emitting layer EML1 may be identically applied to the first sub-light emitting layer EML1. The description of the second light emitting layer EML2 may be identically applied to the second sub-light emitting layer EML2. The description of the fifth light emitting layer EML5 may be identically applied to the third sub-light emitting layer EML5. In addition, the description of the third light emitting layer EML3 may be identically applied to the fourth sub-light emitting layer EML3. The description of the fourth light emitting layer EML4 may be identically applied to the fifth sub-light emitting layer EML4. The description of the sixth light emitting layer EML6 may be identically applied to the sixth sub-light emitting layer EML6. For example, each of the first sub-light emitting layer EML1 and the fourth sub-light emitting layer EML3 is a red light emitting layer. Each of the second sub-light emitting layer EML2 and the sub-fifth light emitting layer EML4 is a green light emitting layer. Each of the third sub-light emitting layer EML5 and the sixth sub-light emitting layer EML6 may be a blue light emitting layer.

An organic electroluminescence display DD (see, e.g., FIG. 1) according to some example embodiments of the inventive concept includes two light emitting units EU1 and EU2 and a charge generation unit CGLU located between the two light emitting units EU1 and EU2. The two light emitting units EU1 and EU2 are stacked in the thickness direction DR3. As a result, the organic electroluminescence display DD has excellent efficiency compared to an organic electroluminescence display device including only one light emitting unit and may have a relatively longer life span. In addition, the organic electroluminescence display DD (see FIG. 1) according to some example embodiments of the inventive concept may also have excellent in heat resistance.

According to the high resolution requirement of the display device, as more masking processes including opening are added, the effect of lower process yield is increasing. The organic electroluminescence display device DD (see, e.g., FIG. 1) according to an embodiment of the inventive concept includes an n-type charge generation layer n-CGL arranged as a common layer without distinguishing light emitting regions, and a charge generation unit CGLU including a p-type charge generation layer p-CGL arranged as a pattern layer in correspondence to each light emitting region. In other words, it includes an n-type charge generation layer n-CGL arranged without using a mask and a p-type charge generation layer p-CGL arranged using a mask. As a result, the processing and manufacturing efficiency may be superior to that of an organic electroluminescence display device in which both the n-type charge generation layer and the p-type charge generation layer are arranged as pattern layers.

On the other hand, when the n-type charge generation layer and the p-type charge generation layer are all arranged as common layers, the amount of leakage current generated due to the charge flowing in the longitudinal direction is increased. Leakage current may mean that the charge flows into the undesired luminescent region, which may cause poor color mixing.

Figure 14:
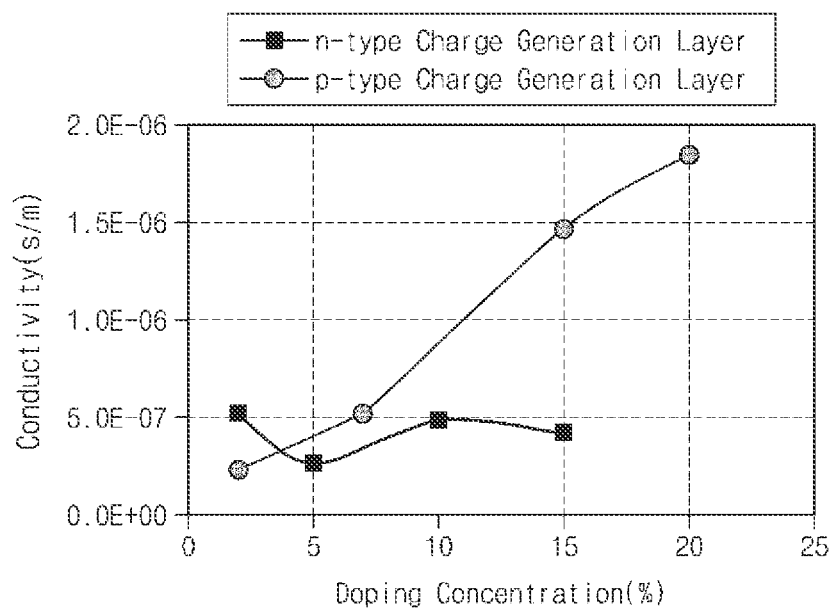
FIG. 14 is a graph showing a change in conductivity depending on the doping concentration of each of an n-type charge generation layer and a p-type charge generation layer according to some example embodiments of the inventive concept.

FIG. 14 is a graph showing a change in conductivity depending on the doping concentration of each of an n-type charge generation layer and a p-type charge generation layer.

Referring to FIG. 14, it may be seen that the p-type charge generation layer has a greater conductivity difference depending on the doping concentration than the n-type charge generation layer. That is, the p-type charge generation layer is more sensitive to the doping concentration change than the n-type charge generation layer. Therefore, it may be predicted that the leakage current is relatively increased in the case of the p-type charge generation layer in which the conductivity increases sharply as the doping concentration increases. Therefore, some example embodiment of the inventive concept may include an organic electroluminescence display device in which the p-type charge generation layer, which has a high probability of causing a color mixture defect due to the flow of charge in the length direction, is arranged as a pattern layer and the n-type charge generation layer, which is relatively unlikely to generate a leakage current, is arranged as a common layer to realize excellent process efficiency, high efficiency, and long life span.

An organic electroluminescence display device according to some example embodiments of the inventive concept may have excellent efficiency and have a relatively long life span.

A method of manufacturing an organic electroluminescence display device according to some example embodiments of the inventive concept may also have a relatively efficient manufacturing process.

Although aspects of some example embodiments of the inventive concept have been described, it is understood that the inventive concept should not be limited to these example embodiments but various changes and modifications can be made by one ordinary skilled in the art within the spirit and scope of the inventive concept as defined in the appended claims and their equivalents.

What is claimed is:

1. An organic electroluminescence display device comprising:
   a substrate including a first light emitting region, a second light emitting region, and a non-light emitting region between the first light emitting region and the second light emitting region;
   a first electrode including a first sub-electrode on the first light emitting region and a second sub-electrode on the second light emitting region;
   a pixel defining layer on the non-light emitting region;
   a first light emitting unit on the first electrode;
   a charge generation unit including an n-type charge generation layer on the first light emitting unit and a p-type charge generation layer on the n-type charge generation layer;
   a second light emitting unit on the charge generation unit; and
   a second electrode on the second light emitting unit,
   wherein the first light emitting unit comprises a first light emitting layer on the first sub-electrode; and a second light emitting layer on the second sub-electrode,
   wherein the second light emitting unit comprises a third light emitting layer on the first light emitting layer; and a fourth light emitting layer on the second light emitting layer,
   wherein the n-type charge generation layer is arranged as a common layer on the first light emitting region, the second light emitting region, and the non-light emitting region; and
   the p-type charge generation layer includes a first p-type charge generation layer arranged as a pattern layer corresponding to the first light emitting region and a second p-type charge generation layer arranged as a pattern layer corresponding to the second light emitting region.

2. The device of claim 1, wherein
   the first light emitting layer and the third light emitting layer emit light of a same color,
   the second light emitting layer and the fourth light emitting layer emit light of a same color, and
   the first light emitting layer and the second light emitting layer emit light of different colors.

3. The device of claim 1, wherein the first p-type charge generation layer and the second p-type charge generation layer are spaced apart from each other.

4. The device of claim 1, wherein
   the first p-type charge generation layer is on the first light emitting layer, and
   the second p-type charge generation layer is on the second light emitting layer.

5. The device of claim 4, wherein
   the substrate further comprises a third light emitting region spaced apart from the first light emitting region and the second light emitting region,
   the first electrode further comprises a third sub-electrode on the third light emitting region, and the third sub-electrode is spaced apart from the first sub-electrode and the second sub-electrode,
   the first light emitting unit further comprises a fifth light emitting layer on the third sub-electrode,
   the second light emitting unit further comprises a sixth light emitting layer on the fifth light emitting layer, and the p-type charge generation layer further comprises a third p-type charge generation layer on the fifth light emitting layer.

6. The device of claim 5, wherein the fifth light emitting layer and the sixth light emitting layer emit light of a same color, and the fifth light emitting layer emits light of a different color from each of the first light emitting layer and the second light emitting layer.

7. The device of claim 5, wherein
each of the first light emitting layer and the third light emitting layer is a red light emitting layer,
each of the second light emitting layer and the fourth light emitting layer is a green light emitting layer, and
each of the fifth light emitting layer and the sixth light emitting layer is a blue light emitting layer.

8. The device of claim 7, wherein the fifth light emitting layer emits a first blue light having a first central wavelength, and the sixth light emitting layer emits a second blue light having a second central wavelength different from the first central wavelength.

9. The device of claim 5, wherein a thickness of the first light emitting layer is greater than a thickness of the second light emitting layer, and the thickness of the second light emitting layer is greater than a thickness of the fifth light emitting layer, and
a thickness of the third light emitting layer is greater than a thickness of the fourth light emitting layer and the thickness of the fourth light emitting layer is greater than a thickness of the sixth light emitting layer.

10. The device of claim 1, wherein the pixel defining layer comprises a polyacrylate resin or a polyimide resin.

11. The device of claim 1, wherein the n-type charge generation layer has a step difference, and each of the first p-type charge generation layer and the second p-type charge generation layer has no step difference.

12. The device of claim 1, wherein
the first light emitting unit further comprises:
a first hole transport layer below the first light emitting layer and the second light emitting layer, and on the first sub-electrode and the second sub-electrode; and
a first electron transport layer on the first light emitting layer and on the second light emitting layer, and below the charge generation unit,
wherein
the second light emitting unit further comprises:
a second hole transport layer below the third light emitting layer and the fourth light emitting layer, and on the charge generation unit; and
a second electron transport layer on the third light emitting layer and the fourth light emitting layer, and below the second electrode.

13. The device of claim 1, wherein a thickness of the n-type charge generation layer is 50 Å to 300 Å, and a thickness of the p-type charge generation layer is 50 Å to 200 Å.

14. The device of claim 1, wherein
the n-type charge generation layer comprises an n-type dopant, and the p-type charge generation layer comprises a p-type dopant,
a doping ratio of the n-type dopant is 1 wt % to 10 wt %, and
a doping ratio of the p-type dopant is 2 wt % to 15 wt %.

15. An organic electroluminescence display device comprising:
a substrate including a first light emitting region, a second light emitting region, and a non-light emitting region;
a first electrode including a first sub-electrode on the first light emitting region and a second sub-electrode on the second light emitting region;
a first light emitting unit on the first electrode;
a charge generation unit including an n-type charge generation layer on the first light emitting unit and a p-type charge generation layer on the n-type charge generation layer;
a second light emitting unit on the charge generation unit; and
a second electrode on the second light emitting unit,
wherein the first light emitting unit comprises a first light emitting layer on the first sub-electrode; and a second light emitting layer on the second sub-electrode,
wherein the second light emitting unit comprises a third light emitting layer on the first light emitting layer; and a fourth light emitting layer on the second light emitting layer,
wherein one of the n-type charge generation layer and the p-type charge generation layer includes a first sub charge generation layer on the first light emitting region and a second sub charge generation layer on the second light emitting region.

16. The device of claim 15, wherein another of the n-type charge generation layer and the p-type charge generation layer overlaps the first light emitting region, the second light emitting region, and the non-light emitting region.

17. The device of claim 15, wherein the non-light emitting region is between the first light emitting region and the second light emitting region, and
wherein the device further comprises a partition part on the substrate corresponding to the non-light emitting region.

18. The device of claim 17, wherein the partition part comprises a polyacrylate resin or a polyimide resin.

19. The device of claim 15, wherein
the substrate further comprises a third light emitting region spaced apart from the first light emitting region and the second light emitting region,
the first electrode further comprises a third sub-electrode spaced apart from the first sub-electrode and the second sub-electrode,
the first light emitting unit further comprises a fifth light emitting layer correspondingly on the third sub-electrode, and
the second light emitting unit further comprises a sixth light emitting layer correspondingly on the fifth light emitting layer.

20. The device of claim 19, wherein the n-type charge generation layer is arranged as a common layer on the first light emitting region, the second light emitting region, the third light emitting region and the non-light emitting region; and
wherein the p-type charge generation layer includes a first p-type charge generation layer arranged as a pattern layer corresponding to the first light emitting region, and a second p-type charge generation layer arranged as a pattern layer corresponding to the second light emitting region, and a third p-type charge generation layer arranged as a pattern layer corresponding to the third light emitting region.

21. The device of claim 20, wherein the third p-type charge generation layer is on the fifth light emitting layer.

22. The device of claim 19, wherein
each of the first light emitting layer and the third light emitting layer is a red light emitting layer, each of the second light emitting layer and the fourth light emitting layer is a green light emitting layer, and each of the fifth light emitting layer and the sixth light emitting layer is a blue light emitting layer.

23. An organic electroluminescence display device comprising:
- a display panel; and
- an input sensing unit on the display panel,
- wherein the display panel comprises:
- a substrate including a first light emitting region, a second light emitting region, and a non-light emitting region;
- a first electrode including a first sub-electrode on the first light emitting region and a second sub-electrode on the second light emitting region;
- a first light emitting unit on the first electrode;
- a charge generation unit including an n-type charge generation layer on the first light emitting unit and a p-type charge generation layer on the n-type charge generation layer;
- a second light emitting unit on the charge generation unit; and
- a second electrode on the second light emitting unit,
- wherein the first light emitting unit comprises a first light emitting layer on the first sub-electrode; and a second light emitting layer on the second sub-electrode,
- wherein the second light emitting unit comprises a third light emitting layer on the first light emitting layer; and a fourth light emitting layer on the second light emitting layer,
- wherein one of the n-type charge generation layer and the p-type charge generation layer includes a first sub charge generation layer on the first light emitting region and a second sub charge generation layer on the second light emitting region.

* * * * *